United States Patent
Kubo et al.

(10) Patent No.: US 10,790,245 B2
(45) Date of Patent: Sep. 29, 2020

(54) HIGH-FREQUENCY CERAMIC BOARD AND HIGH-FREQUENCY SEMICONDUCTOR ELEMENT PACKAGE

(71) Applicants: NGK ELECTRONICS DEVICES, INC., Yamaguchi (JP); NGK INSULATORS, LTD., Aichi (JP)

(72) Inventors: Noboru Kubo, Yamaguchi (JP); Naoki Goto, Yamaguchi (JP)

(73) Assignees: NGK ELECTRONICS DEVICES, INC., Yamaguchi (JP); NGK INSULATORS, LTD., Aichi (JP)

( * ) Notice: Subject to any disclaimer, the term of this patent is extended or adjusted under 35 U.S.C. 154(b) by 0 days.

(21) Appl. No.: 16/230,240

(22) Filed: Dec. 21, 2018

(65) Prior Publication Data

US 2019/0148316 A1     May 16, 2019

Related U.S. Application Data

(63) Continuation of application No. PCT/JP2017/018389, filed on May 16, 2017.

(30) Foreign Application Priority Data

Jun. 27, 2016  (JP) ................................. 2016-127024

(51) Int. Cl.
  *H01L 29/40*    (2006.01)
  *H01L 23/66*    (2006.01)
  (Continued)

(52) U.S. Cl.
  CPC .............. *H01L 23/66* (2013.01); *H01L 23/02* (2013.01); *H01L 23/13* (2013.01); *H01L 23/15* (2013.01);
  (Continued)

(58) Field of Classification Search
  CPC ......... H01L 23/02; H01L 23/13; H01L 23/15; H01L 23/49811; H01L 23/49838; H01L 23/66
  (Continued)

(56) References Cited

U.S. PATENT DOCUMENTS 9,462,709 B2 * 10/2016 Kawazu ................ H01L 23/055
9,922,925 B2 *  3/2018 Kawazu ................ H01L 23/04
(Continued)

FOREIGN PATENT DOCUMENTS

WO     2013/042627 A1     3/2013
WO     2014/192687 A1    12/2014
(Continued)

OTHER PUBLICATIONS

Extended European Search Report issued in European Patent Application No. 17819699.4, dated May 9, 2019 (34 pages).
(Continued)

*Primary Examiner* — Luan C Thai
(74) *Attorney, Agent, or Firm* — Nakanishi IP Associates, LLC

(57) ABSTRACT

A highly reliable high-frequency ceramic board appropriately transmitting signals with high frequencies up to 50 GHz includes a flat ceramic substrate, a pair of ground lines bonded to a peripheral portion of a back surface of the ceramic substrate, a first lead pad electrode bonding the ground lines, at least one pair of signal lines between the ground lines, second lead pad electrodes attached where the
(Continued)

signal lines are bonded, and a groove-like recess between the second lead pad electrodes. The pair of signal lines forms a differential transmission line. An interval $L_{GS}$ between a first edge of the first lead pad electrode and a second edge of a corresponding second lead pad electrode and an interval $L_{SS}$ between facing second edges satisfy $L_{SS} < 2L_{GS}$.

10 Claims, 11 Drawing Sheets

(51) Int. Cl.
  *H01L 23/13* (2006.01)
  *H01L 23/15* (2006.01)
  *H01L 23/02* (2006.01)
  *H05K 1/02* (2006.01)
  *H01L 23/498* (2006.01)
  *H01L 23/057* (2006.01)

(52) U.S. Cl.
  CPC .. *H01L 23/49811* (2013.01); *H01L 23/49838* (2013.01); *H05K 1/02* (2013.01); *H01L 23/057* (2013.01); *H01L 2223/6638* (2013.01)

(58) Field of Classification Search
  USPC .......................................................... 257/664
  See application file for complete search history.

(56) References Cited

U.S. PATENT DOCUMENTS

| 10,068,818 B2* | 9/2018 | Kawazu | ................ H01L 23/043 |
| 2017/0133315 A1 | 5/2017 | Kawazu | |

FOREIGN PATENT DOCUMENTS

| WO | 2015/088028 A1 | 6/2015 |
| WO | 2016/017574 A1 | 2/2016 |
| WO | 2016/186128 A1 | 11/2016 |

OTHER PUBLICATIONS

International Search Report issued in PCT/JP2017/018389 dated Aug. 1, 2017, with English Translation (5 pages).
Witten Opinion of International Searching Authority issued in PCT/JP2017/018389 dated Aug. 1, 2017, with English Translation (International Preliminary Report on Patentability) (8 pages).

* cited by examiner

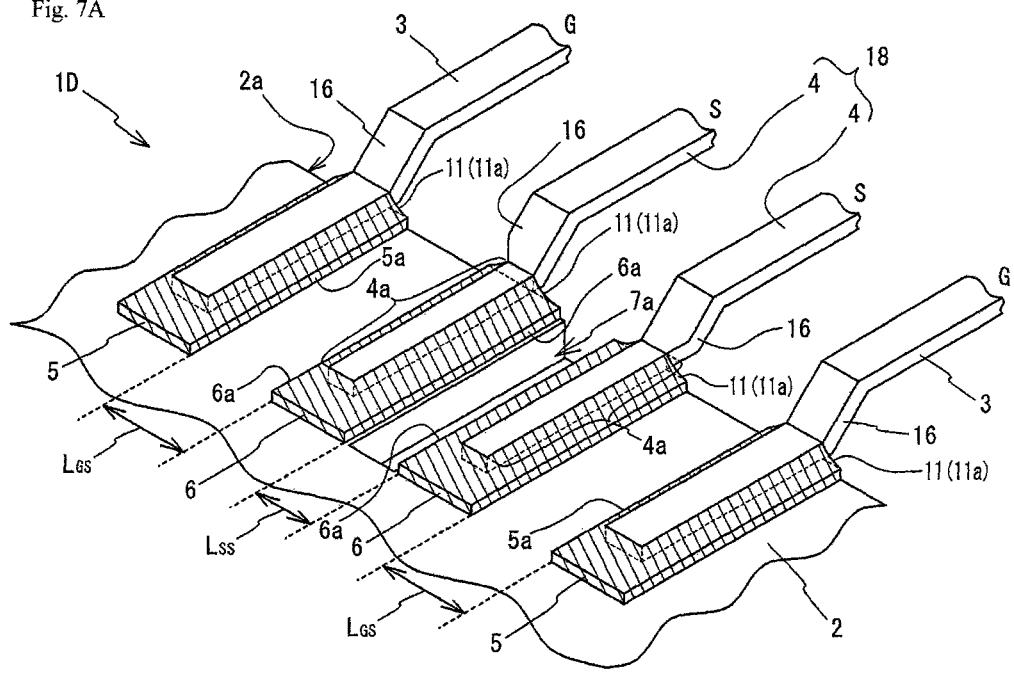
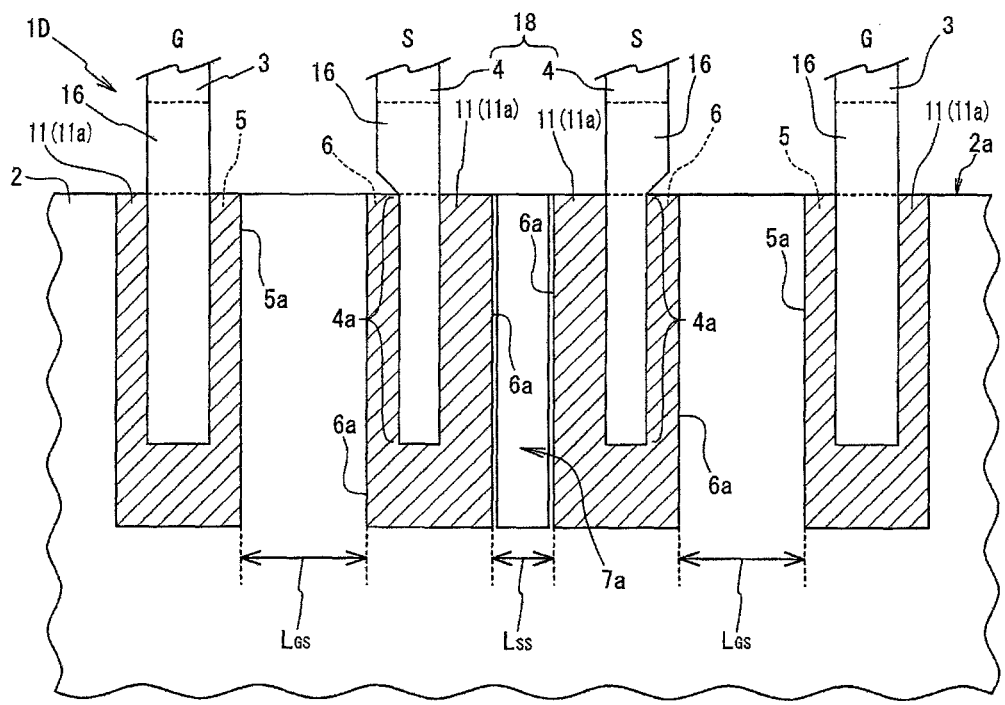

HIGH-FREQUENCY CERAMIC BOARD AND HIGH-FREQUENCY SEMICONDUCTOR ELEMENT PACKAGE

CROSS-REFERENCE TO RELATED APPLICATIONS

This application is a continuation application of International Patent Application No. PCT/JP2017/018389 filed on May 16, 2017, which claims priority to Japanese Patent Application No. 2016-127024 filed on Jun. 27, 2016, the entire contents of which are incorporated by reference.

BACKGROUND OF INVENTION

Field of the Invention

The present invention relates to a high-frequency ceramic board that appropriately transmits high-frequency signals with frequencies exceeding 40 GHz and has less decrease in the strength of its ceramic substrate, and a high-frequency semiconductor element package including the high-frequency ceramic board.

The recent increase in the speed of telecommunications has accelerated the communication speed of electronic devices used in such telecommunications systems. Thus, the packages containing these electronic devices are designed to have high heat dissipation, low-loss transmission of high-frequency signals, and high reliability, which may be achieved by alumina ceramics as promising high-insulating materials.

Such packages have external connection terminals for transmitting high-speed signals. The terminals are typically connected to coplanar lines on the back surface of a ceramic substrate in the package. Through metal lead terminals fixed on the coplanar lines, the terminals are to be connected to grounded coplanar lines on an external resin board.

In response to increasingly smaller high-frequency semiconductor element packages, high-frequency ceramic boards in these packages include wires arranged with narrower pitches.

Such high-frequency ceramic boards using ceramics with a high dielectric constant can decrease the characteristic impedance of the high-frequency signal lines around the lead terminals, and can have poorer high-frequency signal transmission characteristics.

Thus, the substrate part around the lead terminal connection is designed in a particular manner to prevent high-frequency signal transmission characteristics from deteriorating around the lead terminals.

The connection of ground lines and differential transmission lines in ceramic substrates is usually referred to as the ground-signal-signal-ground (GSSG) structure, and some ceramic substrates have a plurality of GSSG sets. The GSSG structure herein includes at least one differential transmission line including a pair of signal lines unless otherwise specified.

Patent Literature 1 entitled Package for Housing Elements and Mounting Structure describes an element package in which elements are mountable, and a mounting structure including the package and elements mounted in the package. Patent Literature 1 describes a package including a substrate having a mounting area for mounting elements on its top surface, a frame on the substrate surrounding the mounting area, and an input/output terminal in the frame for electrical connection between the internal circuit and the external circuit of the frame. The input/output terminal includes a plurality of wiring conductors extending from the internal circuit out of the frame, a ground layer outside the frame, lead terminals connected to the plurality of wiring conductors outside the frame, and ground terminals connected to the ground layer. The input/output terminal has recesses between the lead terminals and the ground terminals.

The package described in Patent Literature 1 can prevent the high-frequency signal transmission characteristics from deteriorating around the lead terminals.

CITATION LIST

Patent Literature

Patent Literature 1: WO 2014/192687

The structure described with reference to FIG. 11 of Patent Literature 1 includes grooves in the ceramic substrate between the ground terminals (ground lines) and the lead terminals, in addition to grooves between the lead terminals (differential transmission lines), to more appropriately prevent deterioration in the high-frequency signal transmission characteristics around the lead terminals.

However, the structure described in Patent Literature 1 may include a plurality of GSSG sets on the ceramic substrate, for which grooves are formed between all the lead terminals, or between all the ground and lead terminals bonded to the ceramic board. A ceramic substrate with such GSSG sets can have lower strength due to many grooves on the surface of the ceramic substrate.

In particular, high-frequency ceramic boards on which semiconductor elements are mounted can have their ceramic substrate receiving heat generated from the semiconductor elements and thus undergoing temperature increase and decrease. The ceramic substrate can expand with heat, and then crack or break at many grooves on the substrate.

The ceramic substrate described with reference to FIG. 6 of Patent Literature 1, which has grooves only between lead terminals, is less likely to have a decrease in the strength described above. However, the ceramic substrate in FIG. 6 of Patent Literature 1 can only improve the transmission characteristics up to about 40 GHz in a high-frequency range (refer to FIG. 7 in Patent Literature 1), and has poor transmission characteristics in a frequency range of 40 to 50 GHz.

SUMMARY OF INVENTION

In response to the above issue, one or more aspects of the present invention are directed to a high-frequency ceramic board that achieves intended transmission characteristics for high-frequency signals with frequencies exceeding 40 GHz and has less decrease in the strength of a ceramic substrate, and a high-frequency semiconductor element package including the high-frequency ceramic board.

Additionally, the high-frequency ceramic board and the high-frequency semiconductor element package including the high-frequency ceramic board according to one or more aspects have less decrease in the bonding strength of signal lines including ground lines or signal lines forming a differential transmission line arranged at intended intervals.

A high-frequency ceramic board according to a first aspect of the present invention includes a flat ceramic substrate, a pair of ground lines (G) bonded to a peripheral portion of a back surface of the ceramic substrate, a first lead pad electrode or a pair of first lead pad electrodes attached where the pair of ground lines (G) is bonded, at least one pair of signal lines (S) bonded between the pair of ground lines (G), second lead pad electrodes attached where the signal lines (S) are bonded, and a groove-like recess between the second lead pad electrodes. The pair of signal lines (S) forms a differential transmission line. Each second lead pad electrode is attached in an area of a cutout in the first lead pad electrode or in an area between the pair of first lead pad electrodes. Each second lead pad electrode has second edges in a longitudinal direction including a second edge facing a first edge of the first lead pad electrode, and the first edge and the second edge facing each other are at least partially parallel to each other. $L_{SS} < 2L_{GS}$, where $L_{GS}$ is an interval between the first edge and the second edge facing each other, and $L_{SS}$ is an interval between facing second edges of adjacent ones of the second lead pad electrodes.

In the first aspect of the invention, the ceramic substrate serves both as an insulator and a dielectric. The ground lines (G) serve as connection terminals to the ground terminal of an external resin board. The differential transmission line including the pair of signal lines (S) serves as an input/output terminal for transmitting and receiving high-frequency signals between external devices and the ceramic board according to the first aspect of the invention.

The first lead pad electrodes or the pair of first lead pad electrodes electrically connects the ground lines (G) to the conductor wires formed on and/or in the ceramic substrate. The second lead pad electrodes electrically connect the signal lines (S) to the conductor wires formed on and/or in the ceramic substrate. In the first aspect of the invention, the pair of signal lines (S) forms one differential transmission line.

The first edge of the first lead pad electrode and the second edge of each second lead pad electrodes are at least partially parallel to each other. The recess is formed between the second lead pad electrodes. $L_{SS} < 2L_{GS}$, where $L_{GS}$ is an interval between the first edge and the second edge facing each other, and $L_{SS}$ is an interval between facing second edges of adjacent ones of the second lead pad electrodes. The ceramic board with this structure can have the characteristic impedance around the second lead pad electrodes approximate to an intended value without a recess between the first and second edges. Thus, the high-frequency ceramic board according to the first aspect of the invention has improved high-frequency signal transmission characteristics, and can transmit high-frequency signals with frequencies exceeding 40 GHz.

The high-frequency ceramic board according to the first aspect of the invention has no recess between the first and second lead pad electrodes, and can reduce a decrease in the strength of the ceramic substrate.

A high-frequency ceramic board according to a second aspect of the invention is the high-frequency ceramic board according to the first aspect in which $D < 1.5W$, where W is a width of each second lead pad electrode, and D is a depth of the recess.

In addition to the advantageous effects of the high-frequency ceramic board according to the first aspect of the invention, the high-frequency ceramic board according to the second aspect of the invention, which defines the relationship between the width W of each second lead pad electrode and the depth D of the recess as $D < 1.5W$, can appropriately adjust the characteristic impedance around the second lead pad electrodes, with a minimum volume of recesses cut in the ceramic substrate. The ceramic board according to the second aspect of the invention thus improves transmission characteristics for high-frequency signals with frequencies exceeding 40 GHz.

The high-frequency ceramic board according to the second aspect of the invention has a minimum volume of recesses in the ceramic substrate to reduce the cutout volume that decreases the strength of the ceramic substrate. Thus, the high-frequency ceramic board according to the second aspect of the invention has higher strength.

A high-frequency ceramic board according to a third aspect of the invention is the high-frequency ceramic board according to the first or second aspect in which the ground lines (G) and the signal lines (S) each have a bend adjacent to the peripheral portion of the ceramic substrate, and $0.1X_1 < X_2 < X_1$, where $X_1$ is a width of the recess adjacent to an end of each signal line (S) bonded to the second lead pad electrode, and $X_2$ is a width of the recess adjacent to the peripheral portion of the ceramic substrate.

In addition to the advantageous effects of the first or the second aspect of the invention, the high-frequency ceramic board according to the third aspect of the invention, which includes the ground lines (G) and the signal lines (S) both having bends, and the second lead pad electrodes separated by a recess to satisfy $0.1X_1 < X_2 < X_1$, where $X_1$ is the width of the recess adjacent to an end of each signal line (S) bonded to the second lead pad electrodes, and $X_2$ is the width of the recess adjacent to the peripheral portion of the ceramic substrate, has a smaller volume of recesses in the peripheral portion of the ceramic board. The ceramic board with this structure appropriately adjusts the characteristic impedance around the bends of the signal lines (S) formed adjacent to the peripheral portion of the ceramic substrate. This structure improves the high-frequency signal transmission characteristics around the bends of the signal lines (S).

The ceramic board according to the third aspect of the invention has a smaller volume of recesses on the peripheral portion of the ceramic substrate, and thus can reduce a decrease in the strength at the peripheral portion of the ceramic substrate.

A high-frequency ceramic board according to a fourth aspect of the invention is the high-frequency ceramic board according to the first or second aspect in which the ground lines (G) and the signal lines (S) each have a bend adjacent to the peripheral portion of the ceramic substrate, and the ceramic substrate has the peripheral portion without the recess.

In addition to the advantageous effects of the first or second aspect of the invention, the ceramic board according to the fourth aspect of the invention, which includes the ground lines (G) and the signal lines (S) each having a bend adjacent to the peripheral portion of the ceramic substrate and the ceramic board having the peripheral portion without the recess, appropriately adjusts the characteristic impedance around the bends of the signal lines (S) near the peripheral portion of the ceramic substrate. This structure improves the high-frequency signal transmission characteristics around the bends of the signal lines (S).

The ceramic board according to the fourth aspect of the invention, which has a smaller volume of recesses on the peripheral portion of the ceramic substrate, can reduce a decrease in the strength of the ceramic substrate at the peripheral portion.

A high-frequency ceramic board according to a fifth aspect of the invention is the high-frequency ceramic board according to any one of the first to fourth aspects in which the pair of ground lines (G) has one differential transmission line between the ground lines (G), and each signal line (S) has a longitudinal cutout in a portion bonded to a corresponding one of the second lead pad electrodes at an edge facing the first edge when the ceramic substrate is viewed from above.

In addition to the advantageous effects of any of the first to the fourth aspects of the invention, the ceramic board according to the fifth aspect of the invention, which includes the signal lines (S) each having a longitudinal cutout in a portion bonded to a corresponding one of the second lead pad electrodes at an edge facing the first edge when the ceramic substrate is viewed from above, forms meniscus areas of a bond, such as a metal brazing material, in the area where the signal lines are cut out.

For the ceramic substrate having the second lead pad electrodes arranged on the back surface to satisfy $L_{SS}<2L_{GS}$, where $L_{GS}$ is an interval between the first edge and the second edge facing each other and $L_{SS}$ is an interval between facing second edges, and the ground lines (G) and the signal lines (S) arranged, for example, at equal intervals, the edges of the signal lines (S) facing the first edges may not have a sufficiently large area for forming meniscuses of a bond, such as a metal brazing material.

Thus, the ceramic board according to the fifth aspect of the invention has a cutout at an edge of each signal line (S) bonded to the second lead pad electrodes and facing the first edge of the first lead pad electrode 5, and forms meniscuses in these cutout areas.

The ceramic board according to the fifth aspect of the invention having cutouts in the signal lines (S) can increase the meniscus area for bonding, and thus increase the bonding strength between the second lead pad electrodes and the signal lines (S).

A high-frequency semiconductor element package according to a six aspect of the present invention includes the high-frequency ceramic board according to any one of the first to fifth aspect of the invention, a semiconductor element mounting pad attached on a main surface of the ceramic substrate, and a ceramic frame surrounding the semiconductor element mounting pad and integrally bonded to the main surface of the ceramic substrate.

The high-frequency semiconductor element package according to the sixth aspect of the invention has the same advantageous effects as the ceramic board according to any one of the first to fifth aspects of the invention.

In the sixth aspect of the invention, the semiconductor element mounting pad electrically connects the ceramic board to semiconductor elements mounted on the ceramic board. The frame supports a lid for hermetically sealing the package accommodating semiconductor elements mounted on the ceramic board.

In the first aspect of the invention, the second lead pad electrodes are arranged close to each other to specify the interval $L_{SS}$ and the interval $L_{GS}$ to satisfy $L_{SS}<2L_{GS}$. In this case, the interval $L_{GS}$ greater than half the interval $L_{SS}$ can weaken the electric field coupling between the second and first lead pad electrodes.

Although the interval $L_{SS}$ smaller than twice the interval $L_{GS}$ in the first aspect of the invention can increase the electric field coupling between the second lead pad electrodes, the recess formed between the second lead pad electrodes in the first aspect of the invention can weaken the electric field coupling between the second lead pad electrodes.

In other words, the increase in the electric field coupling due to the interval $L_{SS}$ smaller than twice the interval $L_{GS}$ in the first aspect of the invention is cancelled by the cavity containing air defined by the recess 7a between the second lead pad electrodes 6.

As described above, the ceramic board according to the first aspect of the invention can appropriately reduce a decrease in the characteristic impedance in the second lead pad electrodes, and also reduces reflection of high-frequency signals in the second lead pad electrodes.

The ceramic board according to the first aspect of the invention can thus appropriately adjust the characteristic impedance around the second lead pad electrodes with no recess between the first and second lead pad electrodes. The ceramic board according to the first aspect of the invention thus transmits high-frequency signals with frequencies exceeding 40 GHz with less reflection loss.

Further, the ceramic board according to the first aspect of the invention having no recess between the first and second lead pad electrodes can reduce a decrease in the strength around the peripheral portion of the ceramic substrate when the ceramic board includes a plurality of GSSG sets.

The ceramic board according to the second aspect of the invention has the same advantageous effects as the ceramic board according to the first aspect of the invention. Further, the ceramic board according to the second aspect of the invention has less cutout volume of ceramics resulting from the formation of recesses.

Thus, the high-frequency ceramic board manufactured and provided according to the second aspect can be more reliable than the high-frequency ceramic board according to the first aspect of the invention.

The ceramic boards according to the third and fourth aspects of the invention can appropriately adjust the characteristic impedance around the bends of the signal lines (S) formed near the peripheral portion of the ceramic substrate.

The ground lines (G) and the signal lines (S) having bends can thus transmit high-frequency signals with frequencies exceeding 40 GHz in a trouble-free manner.

The ceramic boards according to the third and fourth aspects of the invention may reduce a decrease further in the strength at the peripheral portion or at the edge of the ceramic substrate than the ceramic boards according to the first and second aspects of the invention.

The ceramic board according to the fifth aspect of the invention has the same advantageous effects as the ceramic board according to any one of the first to fourth aspects of the invention.

The interval $L_{SG}$ or the interval $L_{SS}$ is typically defined or designed to adjust the characteristic impedance of the second lead pad electrodes to an intended value. When the interval $L_{SS}$ is smaller than twice the interval $L_{SG}$, the interval between the signal lines (S) on the second lead pad electrodes is not always narrowed as intended.

In other words, the dimensions (width and thickness) of the second lead pad electrodes and the dimensions (width and thickness) of the signal lines (S) (differential transmission lines) are defined or designed independently of each other. Thus, the signal lines (S) are not always bonded at optimum positions to increase the bonding strength of the signal lines (S) to the second lead pad electrodes.

When the interval $L_{SS}$ is smaller than twice the interval $L_{GS}$ as in the above aspects of the invention, the bonding strength of the signal lines (S) can be insufficient depending on their positions on the second lead pad electrodes.

When the signal lines (S) are bonded to the second lead pad electrodes with a metal brazing material as a bond, the liquefied metal brazing material forms meniscuses on the edges of the signal lines (S), and integrally fix the signal lines (S) on the second lead pad electrodes. The metal brazing material heated and liquefied on the second lead pad electrodes can wet and spread only on the surfaces of the second lead pad electrodes.

When the interval $L_{SS}$ is smaller than twice the interval $L_{GS}$ as in the above aspects of the invention, the edges of the second lead pad electrodes and the edges of the signal lines (S) can be close to or overlap each other. In this case, the signal lines (S) bonded to the second lead pad electrodes with a metal brazing material may have insufficient meniscuses of the metal brazing material in areas in which the edges of the second lead pad electrodes and the edges of the signal lines (S) are close to or overlap each other. This can greatly decrease the bonding strength of the signal lines (S) to the second lead pad electrodes.

In contrast, the ceramic board according to the fifth aspect of the invention includes the second lead pad electrodes with a width W large enough to prevent a decrease in the bonding strength of the signal lines (S) to the second lead pad electrodes, and further forms areas for meniscus of the metal brazing material large enough to connect the signal lines (S) to the second lead pad electrodes. This structure improves the high-frequency signal transmission characteristics around the second lead pad electrode while preventing a decrease in the bonding strength of the signal lines (S) to the second lead pad electrodes.

The high-frequency ceramic board manufactured and provided according to the fifth aspect of the invention achieves appropriate transmission characteristics in the high-frequency range, the ceramic substrate that is less breakable, and the high bonding strength between the signal lines (S) and the second lead pad electrodes.

The high-frequency semiconductor element package according to the sixth aspect of the invention includes the ceramic board according to any one of the first to fifth aspects of the invention, and has the same advantageous effects as the ceramic board according to any one of the first to fifth aspects of the invention.

The high-frequency semiconductor element package manufactured and provided according to the sixth aspect of the invention including the ceramic board according to the first or second aspect of the invention appropriately transmits high-frequency signals with frequencies exceeding 40 GHz, and is highly reliable with the less breakable ceramic substrate.

The high-frequency semiconductor element package according to the sixth aspect of the invention including the ceramic board according to the third or fourth aspect of the invention includes a ceramic substrate that is less breakable further than the ceramic substrate included in the package according to the sixth aspect including the ceramic board according to the first or second aspect of the invention. Thus, the high-frequency semiconductor element package manufactured and provided according to the sixth aspect of the invention including the ceramic board according to the third or fourth aspect of the invention is more reliable.

The high-frequency semiconductor element package according to the sixth aspect of the invention including the ceramic board according to the fifth aspect of the invention may more reliably prevent a decrease in the bonding strength between the signal lines (S) and the second lead pad electrodes than the package according to the sixth aspect of the invention including the ceramic board according to any one of the first to fourth aspects of the invention. Thus, the high-frequency semiconductor element package manufactured and provided according to the sixth aspect of the invention including the ceramic board according to the fifth aspect of the invention is more reliable.

BRIEF DESCRIPTION OF DRAWINGS

FIG. 7A is a partial perspective view of a GSSG structure in a high-frequency ceramic board according to a fourth embodiment of the present invention, and FIG. 7B is a partial plan view of the GSSG structure.

DETAILED DESCRIPTION

A high-frequency ceramic board according to first to fourth embodiments of the present invention, and a high-frequency semiconductor element package including the high-frequency ceramic board according to the embodiments will now be described in detail.

First Embodiment

First, the basic structure of a high-frequency ceramic board according to a first embodiment of the present invention will now be described with reference to FIGS. 1A to 3B.

Figure 1A:
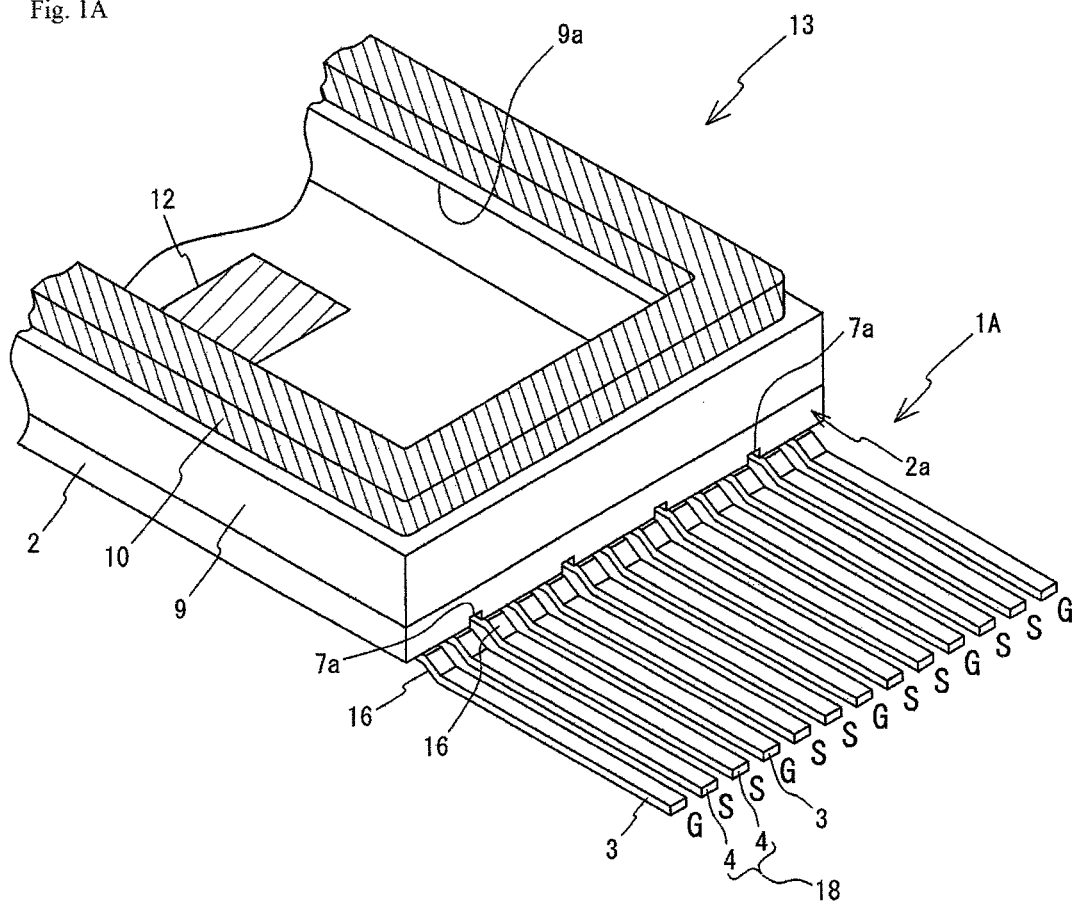
FIG. 1A is a schematic diagram of a high-frequency ceramic board according to a first embodiment of the present invention and a high-frequency semiconductor element package including the high-frequency ceramic board according to the first embodiment.
Figure 1B:
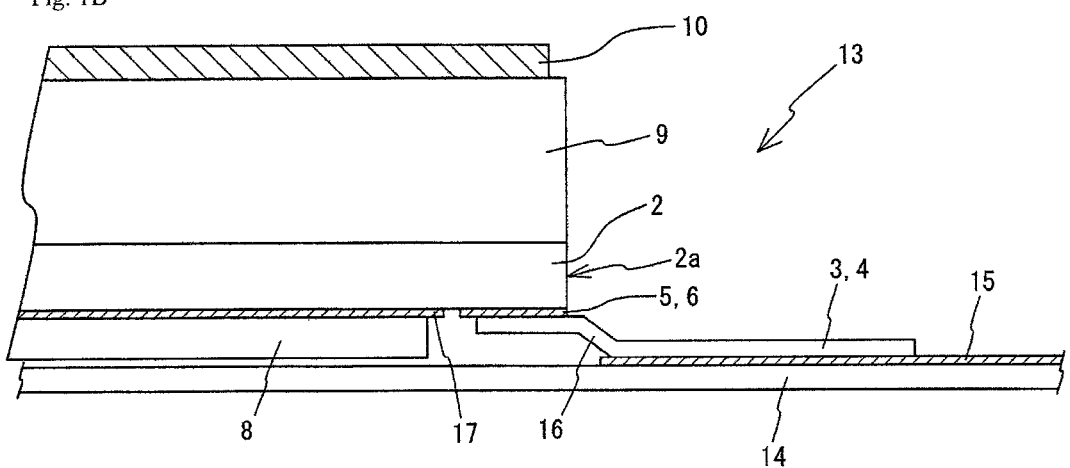
FIG. 1B is a side view of the high-frequency ceramic board and the package in use.
Figures 2A, 2B:
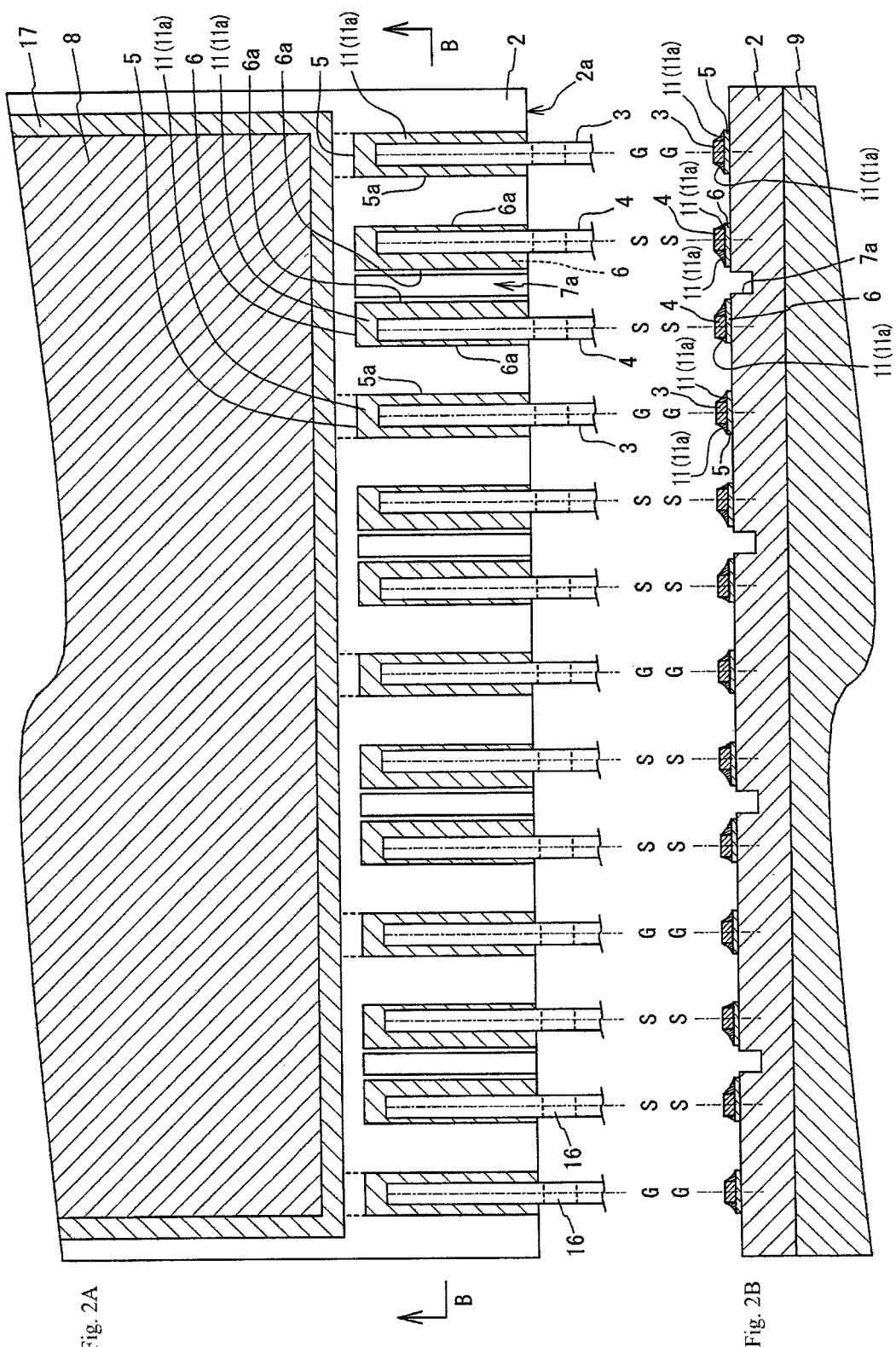
FIG. 2A is a plan view of the high-frequency ceramic board according to the first embodiment of the present invention as viewed from a back surface.
FIG. 2B is a cross-sectional view of the high-frequency ceramic board according to the first embodiment of the present invention.
Figure 3A:
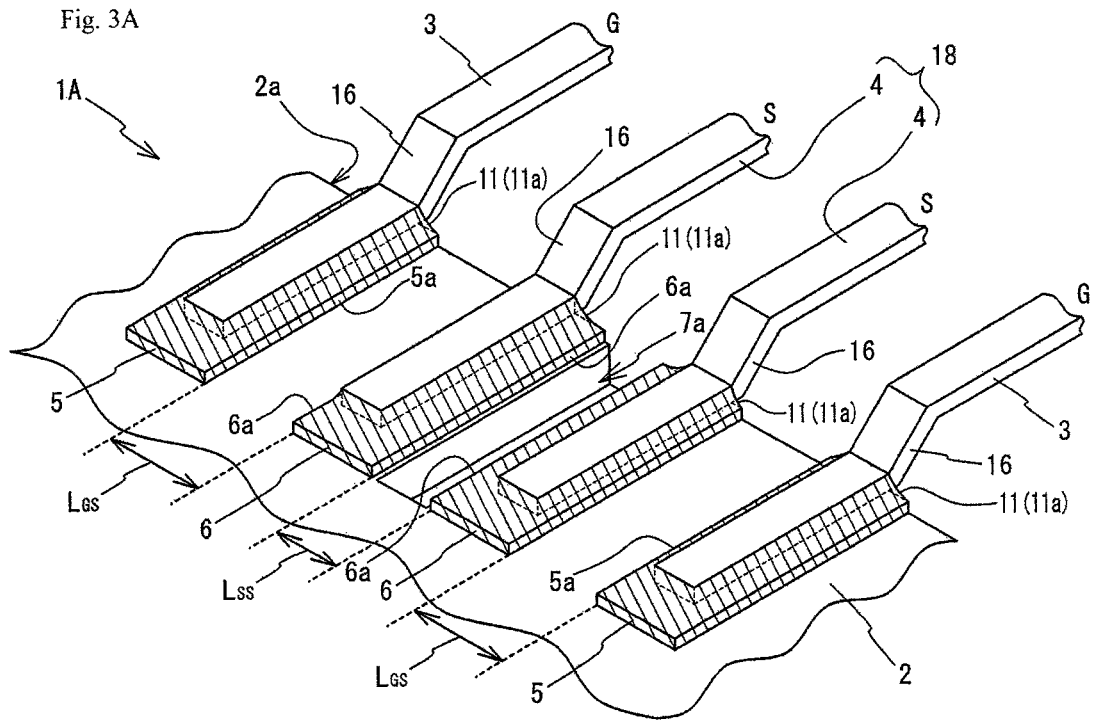
FIG. 3A is a partial perspective view of a GSSG structure in the high-frequency ceramic board according to the first embodiment of the present invention.
Figure 3B:
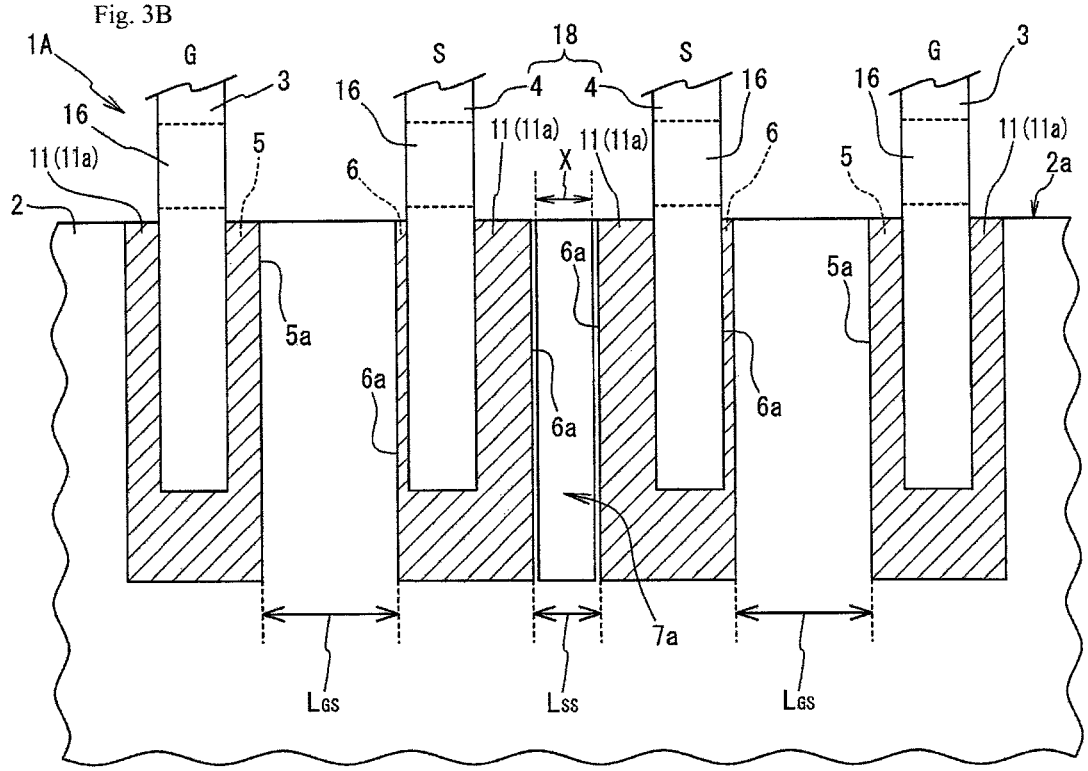
FIG. 3B is a partial plan view of the GSSG structure.

FIG. 1A is a schematic diagram of the high-frequency ceramic board according to the first embodiment and the high-frequency semiconductor element package including the high-frequency ceramic board according to the first embodiment. FIG. 1B is a side view of the high-frequency ceramic board and the package in use. FIG. 2A is a plan view of the high-frequency ceramic board according to the first embodiment as viewed from the back surface. FIG. 2B is a cross-sectional view of the high-frequency ceramic board according to the first embodiment. FIG. 3A is a partial perspective view of a ground-signal-signal-ground (GSSG) structure in the high-frequency ceramic board according to the first embodiment. FIG. 3B is a partial plan view of the GSSG structure.

The high-frequency ceramic board 1A according to the first embodiment will now be described.

As shown in FIGS. 1A, 2A, and 2B, the high-frequency ceramic board 1A according to the first embodiment includes a flat ceramic substrate 2, pairs of ground lines (G) 3 bonded to a peripheral portion 2a of the back surface of the ceramic substrate 2, pairs of first lead pad electrodes 5 attached on the back surface of the ceramic substrate 2 at positions where the ground lines (G) 3 are bonded, at least one pair of signal lines (S) 4 bonded between the ground lines (G) 3 in each pair on the ceramic substrate 2, second lead pad electrodes 6 separately attached where the signal lines (S) 4 are bonded, and groove-like recesses 7a formed between the second lead pad electrodes 6. In the high-frequency ceramic board 1A according to the first embodiment, each pair of signal lines (S) 4 forms one differential transmission line 18.

Further, as shown in FIGS. 2A, 3A, and 3B, each pair of second lead pad electrode 6 in the high-frequency ceramic board 1A according to the first embodiment is located between the two first lead pad electrodes 5 in one pair. The first lead pad electrodes 5 each have first edges 5a. The second lead pad electrodes 6 each have second edges 6a. The first edges 5a and the second edges 6a are at least partially parallel to each other. Each recess 7a between the signal lines (S) 4 extends along the second edges 6a of the corresponding second lead pad electrodes 6.

As shown in FIGS. 3A and 3B, in the high-frequency ceramic board 1A according to the first embodiment, $L_{SS}<2L_{GS}$, where $L_{GS}$ is an interval between the first edge 5a of one first lead pad electrode 5 and the second edge 6a of the adjacent second lead pad electrode 6 facing each other, and $L_{SS}$ is an interval between the second edges 6a of the adjacent second lead pad electrodes 6 facing each other.

The GSSG structure typically includes a virtual ground (G) between the two signal lines (S) 4 in one pair forming one differential transmission line 18. The signal lines (S) 4 and the virtual ground (G) are coupled to each other through an electric field. Thus, when the interval $L_{SS}$ is smaller than twice the interval $L_{GS}$, the electric field coupling between the signal lines (S) 4 and the virtual ground (G) decreases the characteristic impedance around the second lead pad electrodes 6 thus increasing reflection in a high-frequency range. To substantially equalize the strength of the electric field coupling between the second lead pad electrodes 6 and that between the first lead pad electrode 5 and the second lead pad electrode 6, the interval $L_{SS}$ is to be about twice the interval $L_{GS}$.

The high-frequency ceramic board 1A according to the first embodiment includes the second lead pad electrodes 6 arranged closer to each other to have the interval $L_{SS}$ and the interval $L_{GS}$ satisfying $L_{SS}<2L_{GS}$. In other words, the high-frequency ceramic board 1A according to the first embodiment has the interval $L_{GS}$ greater than half the interval $L_{SS}$. The greater interval $L_{GS}$ weakens the electric field coupling between the second lead pad electrode 6 and the first lead pad electrode 5.

In contrast, the smaller interval $L_{SS}$ may strengthen the electric field coupling between the second lead pad electrodes 6 in the high-frequency ceramic board 1A according to the first embodiment. However, each recess 7a between the second lead pad electrodes 6 can weaken the electric field coupling between the second lead pad electrodes 6 for the ceramic board with the interval $L_{SS}$ smaller than twice the interval $L_{GS}$.

This structure can appropriately reduce a decrease in the characteristic impedance of the second lead pad electrodes 6, and reduce the reflection of high-frequency signals in the second lead pad electrodes 6.

The high-frequency ceramic board 1A according to the first embodiment described above has the interval $L_{GS}$ and the interval $L_{SS}$ satisfying $L_{SS}<2L_{GS}$ and has the recess 7a between the second lead pad electrodes 6 facing each other. This can thus appropriately adjust the characteristic impedance around the second lead pad electrodes 6 with no recess 7a between the first lead pad electrode 5 and the second lead pad electrode 6. The high-frequency ceramic board 1A according to the first embodiment has intended transmission characteristics for high-frequency signals with frequencies exceeding 40 GHz.

The high-frequency ceramic board 1A according to the first embodiment receives semiconductor elements mounted on its main surface in use. During use of the high-frequency ceramic board 1A, the ceramic substrate 2 can expand with heat generated from the semiconductor elements. As more recesses 7a are formed on the back surface of the ceramic substrate 2 and/or as the total volume of the recesses increases, the ceramic substrate 2 is more likely to crack or break at the recesses 7a.

As shown in FIGS. 1A and 2B, the high-frequency ceramic board 1A according to the first embodiment may have a plurality of GSSG sets (the high-frequency ceramic board 1A may also include one or more pairs of signal lines (S) or one or more differential transmission lines in each GSSG set). Forming the recesses 7a between adjacent second lead pad electrodes 6 and between adjacent first and second lead pad electrodes 5 and 6 in every GSSG set increases the cutout volume of the ceramic substrate 2 at and around the peripheral portion 2a. The increased cutout volume of the ceramic substrate 2 can decrease the strength of the ceramic substrate 2. Although the recesses between the adjacent first and second lead pad electrodes 5 and 6, in addition to the recesses 7a between the second lead pad electrodes 6, can improve the transmission characteristics of the ceramic substrate 2 in the high-frequency range, the recesses 7a can decrease the strength of the ceramic substrate 2. A high-frequency ceramic board manufactured and provided in the above manner may not achieve high reliability.

In contrast, the high-frequency ceramic board 1A according to the first embodiment has no recesses 7a between the first and second lead pad electrodes 5 and 6, and is less likely to have a decrease in the strength of the ceramic substrate 2.

In the example shown in FIGS. 1A to 3B, the first lead pad electrodes 5 are attached on the back surface of the ceramic substrate 2 in correspondence with the respective ground lines (G) 3. The first lead pad electrodes 5 are not limited to the arrangement shown in FIGS. 1A to 3B.

For example, the first lead pad electrodes 5 may be integrated into an irregularly shaped flat plate for bonding the ground lines (G) 3 in one or more GSSG sets on the back surface of the ceramic substrate 2.

Figure 11A:
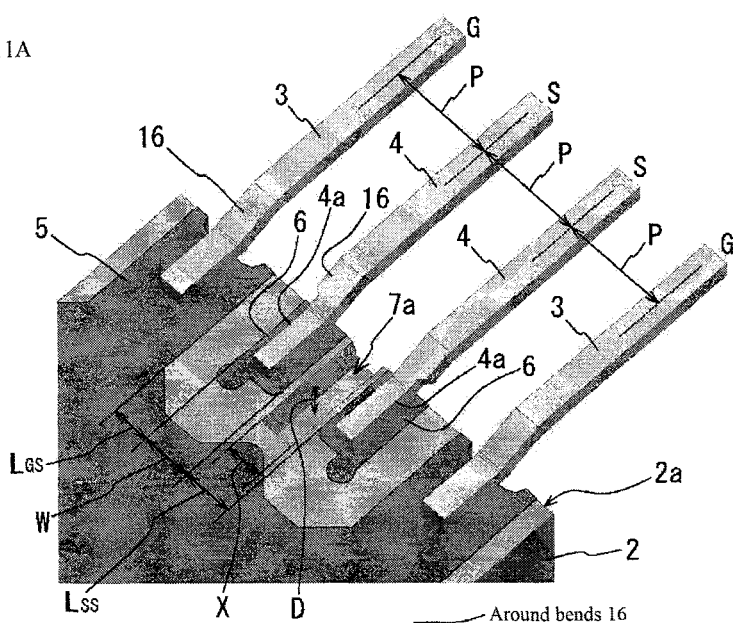
FIG. 11A is a schematic diagram of a GSSG structure according to a working example of the present invention used in simulation 4.

The second lead pad electrodes 6 may be separately formed in partial cutouts in the first lead pad electrode 5 at the peripheral portion 2a of the ceramic substrate 2 (refer to, for example, FIG. 11A).

The high-frequency ceramic board 1A including the first lead pad electrode 5 and the second lead pad electrodes 6 described above also has the same advantageous effects as the high-frequency ceramic board 1A shown in FIGS. 1A to 3B.

In the high-frequency ceramic board 1A according to the first embodiment shown in FIGS. 1A to 3B, the ground lines (G) 3 and the signal lines (S) 4 each have a width within a range of 0.1 to 0.5 mm. The second lead pad electrodes 6 have a width W in a range of 0.1 to 1 mm. The recess 7a has a width X (refer to FIG. 3B) of at least 10 μm.

The depth D of each recess 7a on the ceramic substrate 2 in the high-frequency ceramic board 1A according to the first embodiment will now be described with reference to FIGS. 4A and 4B.

Figure 4A:
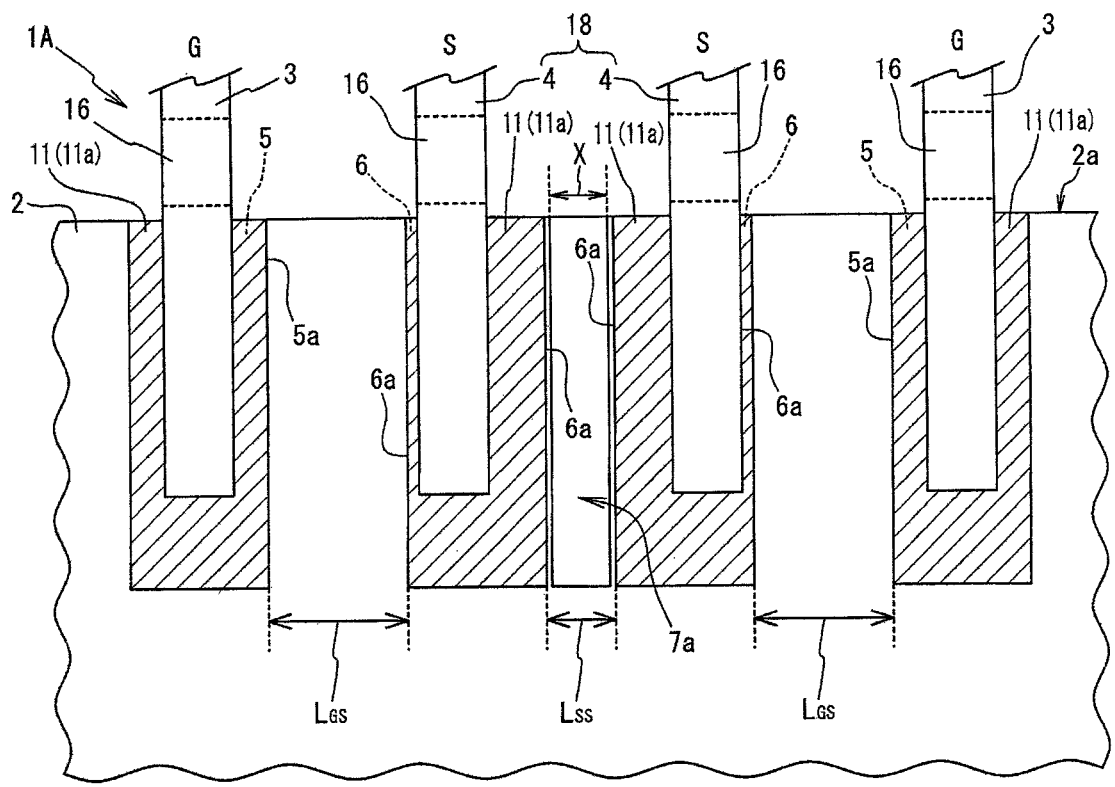
FIG. 4A is a partial plan view of the GSSG structure in the high-frequency ceramic board according to the first embodiment of the present invention.

FIG. 4A is a partial plan view of the GSSG structure in the high-frequency ceramic board according to the first embodiment of the present invention. FIG. 4B is a partial cross-sectional view of the GSSG structure. The same components as in FIGS. 1A to 3B are given the same reference numerals, and will not be described. FIG. 4A is the same as FIG. 3B.

Figure 4B:
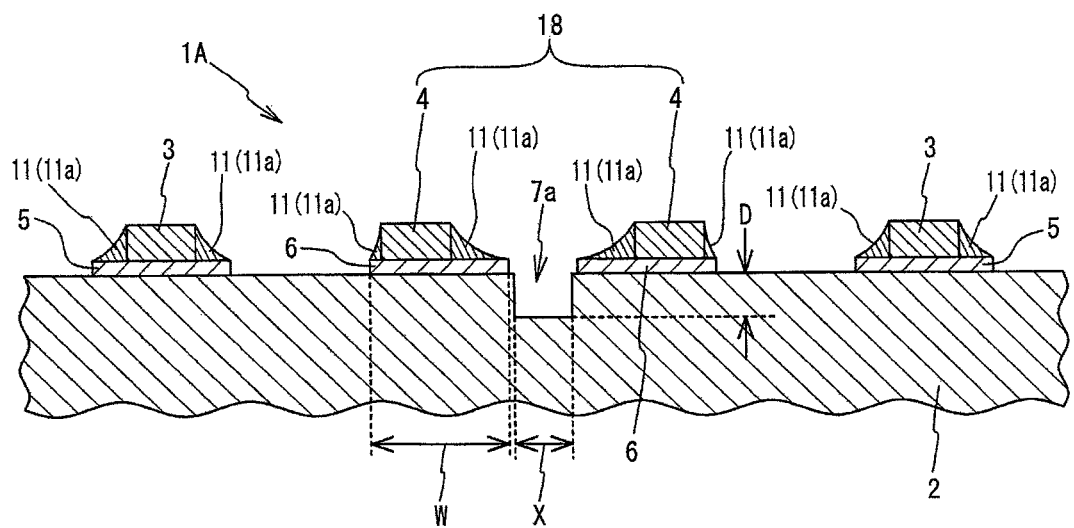
FIG. 4B is a partial cross-sectional view of the GSSG structure.

As shown in FIGS. 4A and 4B, the recess 7a between the signal lines (S) 4 on the ceramic substrate 2 in the high-frequency ceramic board 1A according to the first embodiment may have a depth D within a range of $0.1\,W<D<1.5\,W$.

The high-frequency ceramic board 1A according to the first embodiment having the recess 7a with the depth specified as above can improve the transmission characteristics for the high-frequency signals with frequencies exceeding 40 GHz with minimum cutout volume of the ceramics at the back surface of the ceramic substrate 2.

The high-frequency ceramic board 1A according to the first embodiment may include the ceramic substrate 2 as a ceramic laminate including insulating ceramic layers and conductive metal layers located between the ceramic layers, or a single ceramic layer having a conductive metal attached on its surface.

Although not specifically shown, the first lead pad electrodes 5 attached on the back surface of the ceramic substrate 2 are electrically connected to a semiconductor element mounting pad 12 (described in detail later) for mounting semiconductor elements (not shown) attached on the main surface of the ceramic substrate 2 through a conductive metal wiring pattern arranged inside the ceramic substrate 2.

Known ceramics that may be used for the insulating ceramic substrate in the ceramic substrate 2 in the first embodiment include alumina ceramics, alumina-zirconia ceramics, and glass ceramics.

The conductive metal located between the ceramic layers or attached on the surface of a single or multi-layer ceramic substrate may be appropriately selected from, for example, molybdenum, tungsten, copper, or silver in accordance with the firing temperature of the single layer ceramic substrate or the ceramic laminate.

The lead wires that function as the ground lines (G) 3 or the signal lines (S) 4 may be formed from any electrically conductive metal. For example, the lead wires are formed from an iron-nickel-cobalt alloy in the embodiments of the present invention.

Referring back to FIGS. 1A and 1B, the basic structure of a high-frequency semiconductor element package 13 according to the first embodiment will now be described.

The high-frequency semiconductor element package 13 according to the first embodiment includes the high-frequency ceramic board 1A according to the first embodiment described above. More specifically, the high-frequency semiconductor element package 13 according to the first embodiment includes the high-frequency ceramic board 1A according to the first embodiment, the semiconductor element mounting pad 12 attached on the main surface (opposite to the surface on which the ground lines (G) 3 and the signal lines (S) 4 are bonded), and a frame 9 surrounding the semiconductor element mounting pad 12 and integrally bonded to the main surface of the ceramic substrate 2.

The high-frequency semiconductor element package 13 according to the first embodiment completed for use will include semiconductor elements mounted on the semiconductor element mounting pad 12 on the ceramic substrate 2, and have an opening 9a of the frame 9 sealed with a metal lid (not shown).

The frame 9 may be formed from the same ceramic substrate as used for the ceramic substrate 2. More specifically, the frame 9 may be formed by punching a laminate of ceramic substrate green sheets to form a hollow portion, and combining the hollow laminate integrally with the ceramic substrate 2 yet to be fired.

The high-frequency semiconductor element package 13 according to the first embodiment includes the high-frequency ceramic board 1A described above to expand the usable frequency range to 50 GHz or higher.

The high-frequency semiconductor element package 13 according to the first embodiment in use will now be described in detail.

As shown in FIG. 1B, the high-frequency semiconductor element package 13 according to the first embodiment is mounted on a synthetic resin motherboard 14 by bonding the ends of the ground lines (G) 3 and the signal lines (S) 4 not bonded to the ceramic substrate 2 onto a connection pad 15 attached on the main surface of the motherboard 14 with an electrically conductive bond. The other ends of the ground lines (G) 3 and the signal lines (S) 4 are bonded to the back surface of the ceramic substrate 2.

The signal lines (S) 4 in the high-frequency semiconductor element package 13 according to the first embodiment receive high-frequency electric signals transmitted through the connection pad 15 attached on the motherboard 14, and the ground lines (G) 3 are connected to the ground terminal (connection pad 15) in the motherboard 14 (refer to FIG. 1B).

Optional main components 1 to 4 in the high-frequency semiconductor element package 13 according to the first embodiment will now be described.

1. First Lead Pad Electrode 17

As shown in FIGS. 1B and 2A, the high-frequency semiconductor element package 13 according to the first embodiment may further include, as an optional main component, a first lead pad electrode 17 arranged on the back surface of the ceramic substrate 2 separately from the first lead pad electrodes 5 for bonding the ground lines (G) 3. The first lead pad electrode 17 is electrically connected to the first lead pad electrodes 5 through a conductive metal wiring pattern (not shown) arranged inside the ceramic substrate 2.

The first lead pad electrode 17, which may be included in the high-frequency semiconductor element package 13 according to the first embodiment separately from the first lead pad electrodes 5 for bonding the ground lines (G) 3, serves as a shield layer for preventing high-frequency signals flowing through the ceramic substrate 2 from leaking outside, or for preventing external noise from entering the high-frequency signals flowing through the ceramic substrate 2.

For example, as viewed from above, the three sides (or the perimeter) of the second lead pad electrodes 6 are surrounded by a ground layer including the two first lead pad electrodes 5 in one pair arranged on both sides of the second lead pad electrodes 6, and the first lead pad electrode 17 (refer to FIG. 2A). The package with this structure can reduce leakage of high-frequency signals flowing through the second lead pad electrodes 6, and prevent external noise from entering the high-frequency signals flowing through the second lead pad electrodes 6.

2. Heatsink Plate 8

As shown in FIGS. 1B and 2A, the high-frequency semiconductor element package 13 according to the first embodiment may further include, as an optional main component, a heatsink plate 8 bonded to the first lead pad electrode 17 with a bond (not shown).

The first lead pad electrode 17, in combination with the heatsink plate 8, can serve as a connection pad for the heatsink plate 8, in addition to producing the advantageous effects described above.

The high-frequency semiconductor element package 13 according to the first embodiment additionally including the heatsink plate 8 can efficiently release heat generated from the semiconductor elements bonded onto the semiconductor element mounting pad 12 outside to reduce a temperature increase in the ceramic substrate 2.

This structure reduces cracking or breaking of the ceramic substrate 2 that may expand with an increasing temperature.

3. Metal Ring 10

The basic structure of the high-frequency semiconductor element package 13 according to the first embodiment may further include, as an optional main component, a metal ring 10 at the opening 9a of the frame 9.

For example, the metal ring 10 may be bonded onto a connection pad (not shown) preattached on the top surface of the frame 9 with a bond, such as a metal brazing material. The connection pad may be formed from the same conductive metal as used for the first lead pad electrodes 5 and the second lead pad electrodes 6.

The high-frequency semiconductor element package 13 including the metal ring 10 can have a metal lid (not shown) bonded to the frame 9 by seam welding to cover the opening 9a. In this structure, the frame 9 is highly airtight. The high-frequency semiconductor element package manufactured and provided in the above manner will have higher reliability.

The metal ring 10 may be formed from, for example, an iron-nickel-cobalt alloy.

4. Screw Fastening Structure

The basic structure of the high-frequency semiconductor element package 13 according to the first embodiment may further include, as an optional main component, a screw fastening structure (screw insertion member, not shown) that fastens the high-frequency semiconductor element package 13 onto the motherboard 14 with screws.

The screw fastening structure may include, for example, a flat plate (or bent plate, not shown) integrally or separately extending from an edge of the ceramic substrate 2 other than the edge to which the ground lines (G) 3 and the signal lines (S) 4 are bonded, and screw receptacle holes for receiving screws.

The ceramic substrate 2 may have at least a pair of such screw fastening structures on right and left ends, or may have two or more pairs of such screw fastening structures on right and left ends. The flat plate that serves as each screw fastening structure may be formed from a metal or a ceramic material.

The basic structure of the high-frequency semiconductor element package 13 according to the first embodiment additionally including such screw fastening structures can greatly improve the reliability in mounting the high-frequency semiconductor element package 13 onto the motherboard 14.

The basic structure of the high-frequency semiconductor element package 13 according to the first embodiment may additionally include the first lead pad electrode 17, the metal ring 10, or the screw fastening structures, either alone or by combining two or more of these optional components.

The basic structure of the high-frequency semiconductor element package 13 according to the first embodiment may additionally include the heatsink plate 8 as an optional main component when the high-frequency ceramic board 1A according to the first embodiment includes the first lead pad electrode 17.

Second Embodiment

The basic structure of a high-frequency ceramic board according to a second embodiment of the present invention, and a high-frequency semiconductor element package including the high-frequency ceramic board according to the second embodiment will now be described with reference to FIG. 5.

Figure 5:
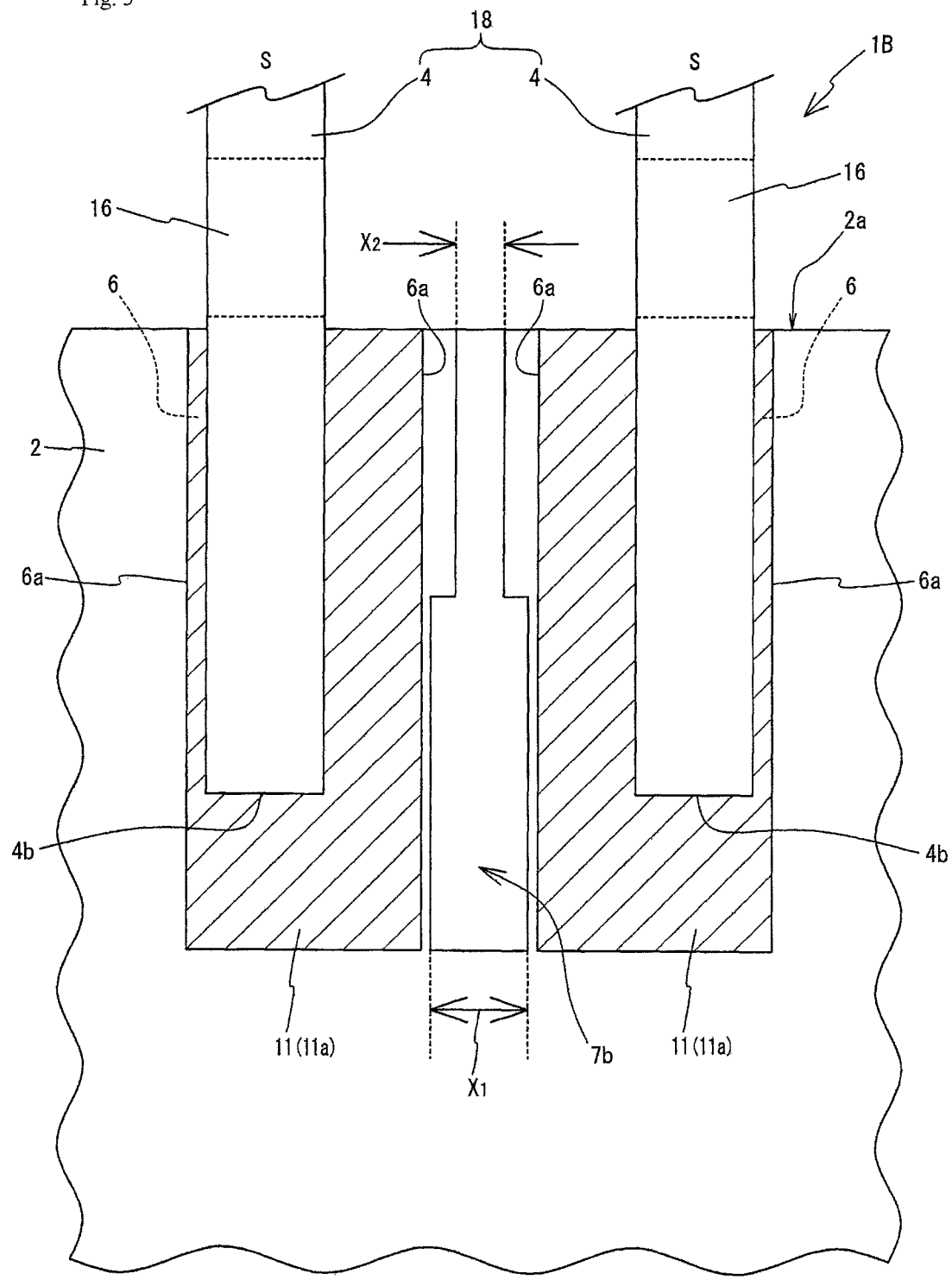
FIG. 5 is a partial plan view of a GSSG structure in a high-frequency ceramic board according to a second embodiment of the present invention.

FIG. 5 is a partial plan view of the GSSG structure in the high-frequency ceramic board according to the second embodiment. The same components as in FIGS. 1A to 4B are given the same reference numerals, and will not be described.

Referring back to FIG. 1A, the high-frequency ceramic board 1A according to the first embodiment includes the ground lines (G) 3 and the signal lines (S) 4 with the bends 16 near the peripheral portion 2a of the ceramic substrate 2. The bends 16 are not mounted on the motherboard 14 and are exposed to air. Such unmounted areas (bends 16) of the signal lines (S) 4 may locally have a higher characteristic impedance than intended, and can have poor transmission characteristics particularly in a frequency range of 35 to 50 GHz.

In response to this, a high-frequency ceramic board 1B according to the second embodiment has the technical features described below, in addition to the basic structure of the high-frequency ceramic board 1A according to the first embodiment.

As shown in FIG. 5, the high-frequency ceramic board 1B according to the second embodiment has a recess 7b formed between signal lines (S) 4. The recess 7b has a width $X_1$ near ends 4b of the signal lines (S) 4 bonded to second lead pad electrodes 6, and a width $X_2$ on a peripheral portion 2a of a ceramic substrate 2. The width $X_1$ is greater than the width $X_2$.

More specifically, the widths $X_1$ and $X_2$ of the recess 7*b* in the high-frequency ceramic board 1B according to the second embodiment satisfy $0.1X_1 < X_2 < X_1$.

The ceramic board with this structure reduces the characteristic impedance of the signal lines (S) 4 around the unmounted areas (bends 16) to near an intended value.

Thus, the high-frequency ceramic board 1B according to the second embodiment can have appropriate transmission characteristics for high-frequency signals with frequencies exceeding 40 GHz although the ground lines (G) 3 and the signal lines (S) 4 have bends 16 near the peripheral portion 2*a* of the ceramic substrate 2.

The high-frequency semiconductor element package according to the second embodiment (not shown) has the same basic structure as the high-frequency semiconductor element package 13 according to the first embodiment except that the high-frequency ceramic board 1A is replaced with the high-frequency ceramic board 1B according to the second embodiment.

The high-frequency semiconductor element package according to the second embodiment can produce the same advantageous effects as the high-frequency semiconductor element package 13 according to the first embodiment, in addition to the advantageous effects of the high-frequency ceramic board 1B according to the second embodiment.

The basic structure of the high-frequency semiconductor element package according to the second embodiment may additionally include the first lead pad electrode 17, the metal ring 10, or the screw fastening structures, either alone or by combining two or more of these optional components as described above.

The heatsink plate 8 can be added to the basic structure as an optional main component when the high-frequency semiconductor element package according to the second embodiment includes the first lead pad electrode 17.

In this manner, the high-frequency semiconductor element package according to the second embodiment additionally including one or more of the optional main components can produce the advantageous effects of the optional main component(s) added alone or in combination, in addition to the advantageous effects of the high-frequency semiconductor element package according to the second embodiment.

Third Embodiment

The basic structure of a high-frequency ceramic board according to a third embodiment of the present invention and a high-frequency semiconductor element package including the high-frequency ceramic board according to the third embodiment will now be described with reference to FIG. 6.

Figure 6:
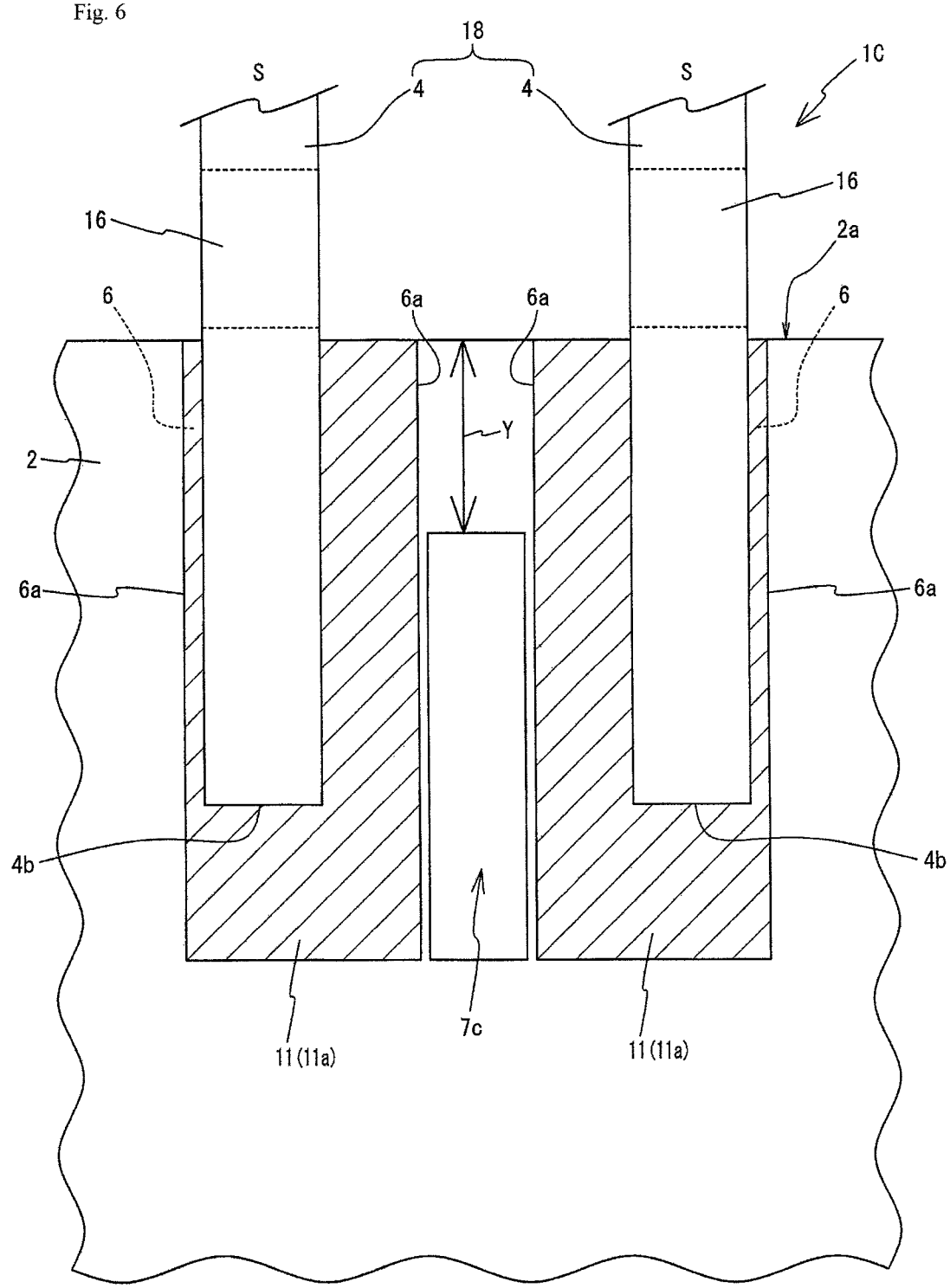
FIG. 6 is a partial plan view of a GSSG structure in a high-frequency ceramic board according to a third embodiment of the present invention.

FIG. 6 is a partial plan view of the GSSG structure in the high-frequency ceramic board according to the third embodiment. The same components as in FIGS. 1A to 5 are given the same reference numerals, and will not be described.

A high-frequency ceramic board 1C according to the third embodiment has the same purpose and advantageous effects as the high-frequency ceramic board 1B according to the second embodiment, but has a different structure.

The high-frequency ceramic board 1C according to the third embodiment further includes the technical features described below, in addition to the basic structure of the high-frequency ceramic board 1A according to the first embodiment.

As shown in FIG. 6, the high-frequency ceramic board 1C according to the third embodiment has a recess 7*c* that does not extend to the portion overlapping the peripheral portion 2*a* of the ceramic substrate 2.

More specifically, the high-frequency ceramic board 1C according to the third embodiment has a distance Y from the end of the peripheral portion 2*a* of the ceramic substrate 2 to the recess 7*c* within a range of $0.01 \text{ mm} < Y < 0.5 \text{ mm}$.

The high-frequency ceramic board 1C according to the third embodiment can reduce the characteristic impedance around unmounted areas (bends 16) of signal lines (S) 4 to near an intended value.

Thus, the high-frequency ceramic board 1C according to the third embodiment can have appropriate transmission characteristics for high-frequency signals with frequencies exceeding 40 GHz when the ground lines (G) 3 and the signal lines (S) 4 have bends 16 near the peripheral portion 2*a* of the ceramic substrate 2.

The high-frequency semiconductor element package according to the third embodiment (not shown) has the same basic structure as the high-frequency semiconductor element package 13 according to the first embodiment except that the high-frequency ceramic board 1A is replaced with the high-frequency ceramic board 1C according to the third embodiment.

The high-frequency semiconductor element package according to the third embodiment can produce the same advantageous effects as the high-frequency semiconductor element package 13 according to the first embodiment, in addition to the advantageous effects of the high-frequency ceramic board 1C according to the third embodiment.

The basic structure of the high-frequency semiconductor element package according to the third embodiment may additionally include the first lead pad electrode 17, the metal ring 10, or the screw fastening structures, either alone or by combining two or more of these optional components.

The heatsink plate 8 can be added to the basic structure as an optional main component when the high-frequency semiconductor element package according to the third embodiment includes the first lead pad electrode 17.

In this manner, the high-frequency semiconductor element package according to the third embodiment additionally including one or more of the optional main components can produce the advantageous effects of the optional main component added alone or in combination, in addition to the advantageous effects of the high-frequency semiconductor element package according to the third embodiment.

Fourth Embodiment

A standardized product of a high-frequency ceramic board for a high-frequency semiconductor element package can typically include the ground lines (G) 3 and the signal lines (S) 4 arranged at equal intervals.

In contrast, the high-frequency ceramic boards 1A to 1C according to the first to third embodiments shown in FIGS. 2A to 6 each include the first lead pad electrodes 5 and the second lead pad electrodes 6 that are arranged at unequal intervals, or in other words, the interval $L_{SS}$ is different from the interval $L_{GS}$.

In the high-frequency ceramic boards 1A to 1C according to the first to third embodiments, the lead wires that serve as the ground lines (G) 3 and the signal lines (S) 4 are arranged at equal intervals on the first lead pad electrodes 5 and the second lead pad electrodes 6. In this case, the edges of the signal lines (S) 4 and the second edges 6a of the second lead pad electrodes 6 are either close to or overlapping each other.

The ground lines (G) 3 and the signal lines (S) 4 are typically bonded to the first lead pad electrodes 5 and the second lead pad electrodes 6 with a metal brazing material 11.

The metal brazing material 11 molten on the first lead pad electrodes 5 or the second lead pad electrodes 6 forms meniscuses 11a to connect the ground lines (G) 3 or the signal lines (S) 4 integrally to the first lead pad electrodes 5 or the second lead pad electrodes 6.

When the second lead pad electrodes 6 have a greater width than the signal lines (S) 4 to allow the metal brazing material 11 for bonding them to form meniscuses 11a sufficiently on the edges of the signal lines (S) 4 facing the first edges 5a, the signal lines (S) 4 and the second lead pad electrodes 6 will have no decrease in the bonding strength between them. As described above, reducing the width W of the second lead pad electrodes 6 in the ceramic substrate 2 can effectively adjust the characteristic impedance around the second lead pad electrodes 6.

If the ground lines (G) 3 and the signal lines (S) 4 are arranged at equal intervals on the first lead pad electrodes 5 and the second lead pad electrodes 6 with a narrower width W, the edge of each signal line (S) 4 facing the first edge 5a is either close to or overlapping the second edge 6a of each second lead pad electrode 6 on which the signal line (S) 4 is bonded.

In this case, the metal brazing material 11 cannot form meniscus 11a sufficiently between the edge of each signal line (S) 4 facing the first edge 5a and the second edge 6a of each second lead pad electrode 6. This can greatly decrease the bonding strength between the signal lines (S) 4 and the second lead pad electrodes 6.

This issue may be overcome by a high-frequency ceramic board 1D according to a fourth embodiment and a high-frequency semiconductor element package including the high-frequency ceramic board 1D according to the fourth embodiment.

The basic structure of the high-frequency ceramic board 1D according to the fourth embodiment will now be described with reference to FIGS. 7A and 7B.

FIG. 7A is a partial perspective view of the GSSG structure in the high-frequency ceramic board according to the fourth embodiment of the present invention. FIG. 7B is a partial plan view of the GSSG structure. The same components as in FIGS. 1A to 6 are given the same reference numerals, and will not be described. In the high-frequency ceramic board 1D according to the fourth embodiment, the GSSG structure formed in the ceramic substrate 2 includes a pair of signal lines (S) 4 arranged adjacent to each other between a pair of ground lines (G) 3.

As shown in FIGS. 7A and 7B, the high-frequency ceramic board 1D according to the fourth embodiment basically has the same structure as the high-frequency ceramic board 1A according to the first embodiment, except the signal lines (S) 4 each having a cutout 4a in the area bonded to the second lead pad electrodes 6 along the first edge 5a as the ceramic substrate 2 is viewed from above.

The high-frequency ceramic board 1D according to the fourth embodiment described above has the cutouts 4a on the edges of the signal lines (S) 4 facing the ground lines (G) 3 to allow the metal brazing material 11 to form the meniscuses 11a in areas defined by the cutouts 4a.

This structure increases the bonding strength between the signal lines (S) 4 and the second lead pad electrodes 6.

Thus, the high-frequency ceramic board 1D manufactured and provided according to the fourth embodiment can be more reliable than the high-frequency ceramic boards 1A to 1C according to the first to third embodiments when the ground lines (G) 3 and the signal lines (S) 4 are arranged at equal intervals on the ceramic substrate 2.

In the high-frequency ceramic board 1D according to the fourth embodiment, too narrow signal lines (S) 4 with the cutouts 4a can break. Thus, the signal lines (S) 4 have a width of at least 0.1 mm after the cutouts 4a are formed in the high-frequency ceramic board 1D according to the fourth embodiment.

The meniscuses 11a formed between each second edge 6a of the second lead pad electrodes 6 and a corresponding edge of the signal lines (S) 4 with the cutouts 4a may have a width of at least 0.1 mm when the second lead pad electrodes 6 are viewed from above. This structure will be described in more detail. If the signal lines (S) 4 bonded to the second lead pad electrodes 6 with the metal brazing material 11 are sufficiently wide, the bonding strength is sufficiently high although the second lead pad electrodes 6 have the same width as the signal lines (S) 4.

However, when parts of the signal lines (S) 4 bonded to the second lead pad electrodes 6 are too narrow as in the embodiments, the bonding strength may be insufficient with the same bonding method described above. The meniscuses 11a are formed on both edges of the signal lines (S) 4 to bond to the second lead pad electrodes 6 to reinforce the bonding strength of the signal lines (S) 4.

Thus, the second lead pad electrodes 6 in the high-frequency ceramic board 1D according to the fourth embodiment may have the width defined below for an area to form meniscuses 11a sufficiently at the edges or the peripheries of the signal lines (S) 4 to bond to the second lead pad electrodes 6. The width W of the second lead pad electrodes 6 may be defined to enable the meniscuses 11a having a width of at least 0.1 mm to form on both edges of the signal lines (S) when the signal lines (S) 4 are bonded to the second lead pad electrodes 6. In other words, the second lead pad electrodes 6 may have a width W that is at least 0.2 mm greater than the width (mm) of the signal lines (S) 4 as viewed from above.

The high-frequency semiconductor element package according to the fourth embodiment (not shown) has the same basic structure as the high-frequency semiconductor element package 13 according to the first embodiment except that the high-frequency ceramic board 1A is replaced with the above high-frequency ceramic board 1D according to the fourth embodiment.

The high-frequency semiconductor element package according to the fourth embodiment can thus produce the same advantageous effects as the high-frequency semiconductor element package 13 according to the first embodiment, in addition to the advantageous effects of the high-frequency ceramic board 1D according to the fourth embodiment.

The basic structure of the high-frequency semiconductor element package according to the fourth embodiment may additionally include the first lead pad electrode 17, the metal ring 10, or the screw fastening structures, either alone or by combining two or more of these optional components.

The basic structure may additionally include the heatsink plate 8 as an optional main component when the high-frequency ceramic board according to the fourth embodiment includes the first lead pad electrode 17.

In this manner, the high-frequency semiconductor element package according to the fourth embodiment further including one or more optional main components can produce the advantageous effects of the optional main component(s) added alone or in combination, in addition to the advantageous effects of the high-frequency semiconductor element package according to the fourth embodiment.

The simulation results for confirming the advantageous effects of the high-frequency ceramic boards according to the embodiments of the present invention will now be described.

Simulations 1 to 4 were conducted using ceramic boards each including the first lead pad electrodes 5 for bonding the pair of ground lines (G) 3 integral as one piece, and the pair of second lead pad electrodes 6 for bonding the pair of signal lines (S) 4 attached in the cutout formed in the integral first lead pad electrode 5 at the peripheral portion 2a of the ceramic substrate 2. To equalize the conditions for all the simulations, the ground lines (G) 3 and the signal lines (S) 4 are arranged with a constant pitch P.

Although simulations 1 to 4 use alumina as the material for the ceramic substrate 2 (dielectric substrate), the material for the ceramic substrate 2 may be any other ceramic materials, such as glass ceramics or aluminum nitride. The dimensions of the part with the GSSG structure are varied in accordance with the relative dielectric constant of the ceramic substrate 2 used in each simulation.

Typically, ceramic wiring boards for mounting electronic components (semiconductor elements) or optical components include wide first lead pad electrodes 5 and second lead pad electrodes 6 for bonding lead wires (e.g., the ground lines (G) 3 and the signal lines (S) 4) to provide wider areas for the meniscuses 11a of the metal brazing material 11 for bonding the lead wires and to increase the bonding strength of the lead wires.

For example, when lead wires such as the ground lines (G) 3 and the signal lines (S) 4 are arranged with a pitch of 0.8 mm on the ceramic substrate 2, and the first lead pad electrodes 5 and the second lead pad electrodes 6 have a width greater than 0.3 mm, the electric field coupling between the first and second lead pad electrodes 5 and 6 can increase. This can decrease the characteristic impedance in this area, thus deteriorating high-frequency signal transmission characteristics in the range of 35 to 50 GHz.

Figure 8A:
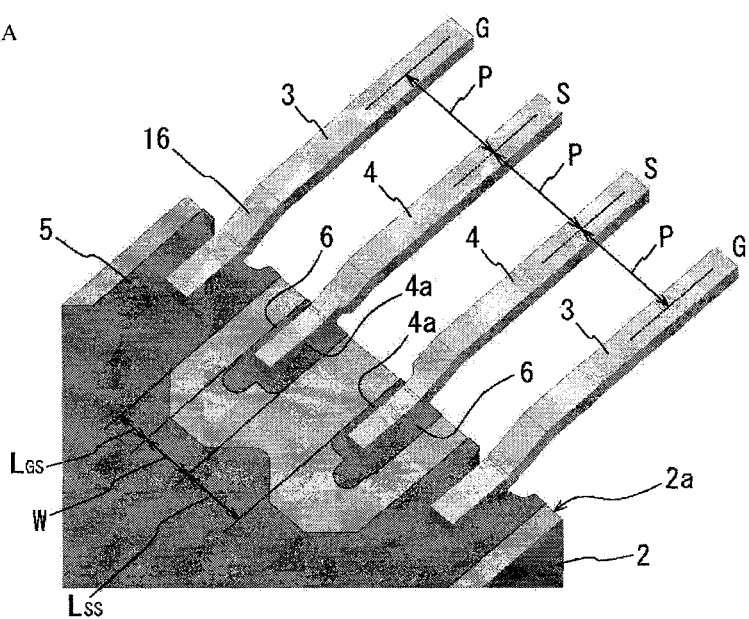
FIG. 8A is a schematic diagram of a GSSG structure 1 used in simulation 1.
Figure 8B:
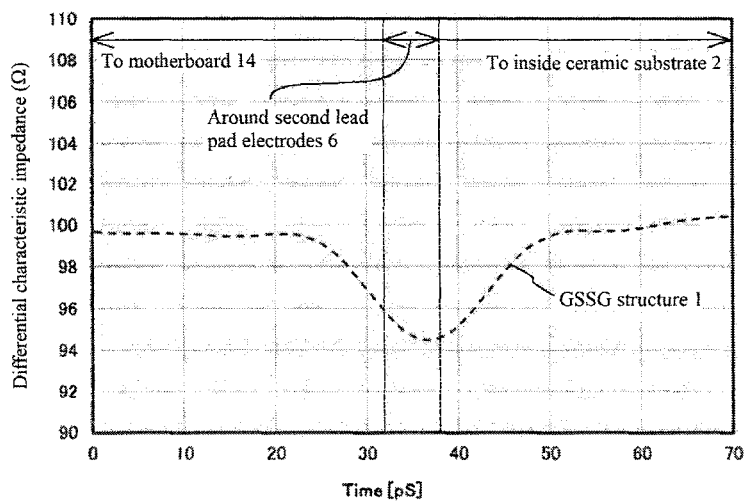
FIG. 8B is a graph showing the simulation results for the characteristic impedance (Ω) of signal lines (S) (differential transmission lines) in the GSSG structure 1.
Figure 8C:
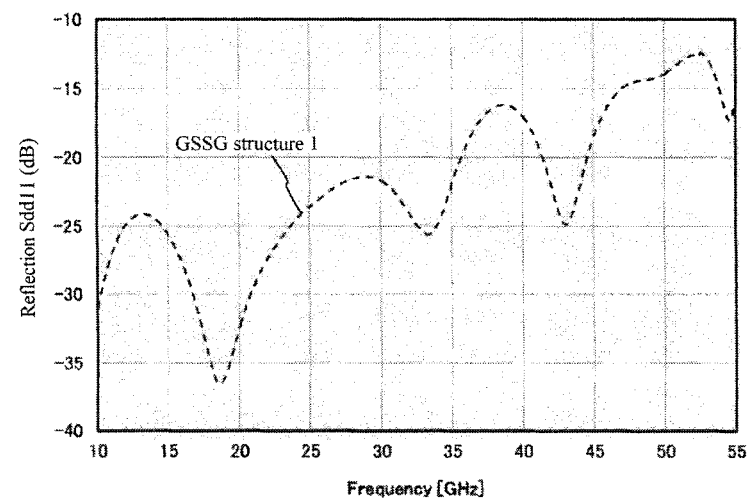
FIG. 8C is a graph showing the simulation results for a reflection Sdd11 (dB) of the signal lines (S) (differential transmission lines) in the GSSG structure 1.

Simulation 1 uses a GSSG structure 1 (comparative example) shown in FIG. 8A to determine the characteristic impedance (Ω) and the reflection Sdd11 (dB) around the bonding of the signal lines (S) 4. The results are shown in FIGS. 8B and 8C.

FIG. 8A is a schematic diagram of the GSSG structure 1 used in simulation 1. FIG. 8B is a graph showing the simulation results for the characteristic impedance (Ω) of the signal lines (S) (differential transmission line) in the GSSG structure 1. FIG. 8C is a graph showing the simulation results for the reflection Sdd11 (dB) of the signal lines (S) (differential transmission line) in the GSSG structure 1. The same components as in FIGS. 1A to 7B are given the same reference numerals, and will not be described.

For the GSSG structure 1 used in simulation 1 shown in FIG. 8A, the materials used for the ceramic substrate 2, the ground lines (G) 3, the signal lines (S) 4, the first lead pad electrodes 5, and the second lead pad electrodes 6 are shown in Table 1 below. For the GSSG structure 1 used in simulation 1 shown in FIG. 8A, the dimensions used for the interval $L_{GS}$, the interval $L_{SS}$, the pitch P, the width W of the second lead pad electrodes 6, and the width of the lead wires forming the ground lines (G) 3 and the signal lines (S) 4 are shown in Table 1 below.

FIG. 8A does not show the metal brazing material 11 for bonding the ground lines (G) 3 or the signal lines (S) 4 to the first lead pad electrodes 5 or the second lead pad electrodes 6, or the meniscuses 11a formed by the metal brazing material 11.

TABLE 1

| GSSG Structure 1 | Material/Dimensions |
|---|---|
| Ceramic substrate 2 | Alumina |
| Ground line (G) 3 | Iron-nickel-cobalt alloy |
| Signal line (S) 4 | Iron-nickel-cobalt alloy |
| First lead pad electrode 5 | Tungsten metalized/Ni-plated/Au-plated |
| Second lead pad electrode 6 | Tungsten metalized/Ni-plated/Au-plated |
| Metal brazing material 11 for meniscus 11a | Silver braze |
| $L_{GS}$ | 0.225 mm |
| $L_{SS}$ | 0.45 mm |
| P | 0.8 mm |
| W | 0.4 mm |
| Width of lead wire | 0.2 mm |
| Width of lead wire portion with cutout 4a | 0.15 mm |

As shown in FIG. 8B, the GSSG structure 1 has a characteristic impedance of about 94Ω around the second lead pad electrodes 6, which is much lower than the target value of 100Ω. Thus, as shown in FIG. 8C, the S parameter Sdd11 (dB), which indicates reflection, also exceeds −20 dB around a frequency of 35 GHz. The GSSG structure 1 shown in FIG. 8A is usable for a frequency range up to about 35 GHz.

Based on the results of simulation 1 above, a GSSG structure 2 (comparative example) was designed to adjust the characteristic impedance around the second lead pad electrodes 6 to near 100Ω. More specifically, the width W of the second lead pad electrodes 6 in the GSSG structure 2 is smaller than the width W of the second lead pad electrodes 6 in the GSSG structure 1.

The GSSG structure 2 and the results of simulation 2 using the GSSG structure 2 will now be described with reference to FIGS. 9A to 9C.

Figure 9A:
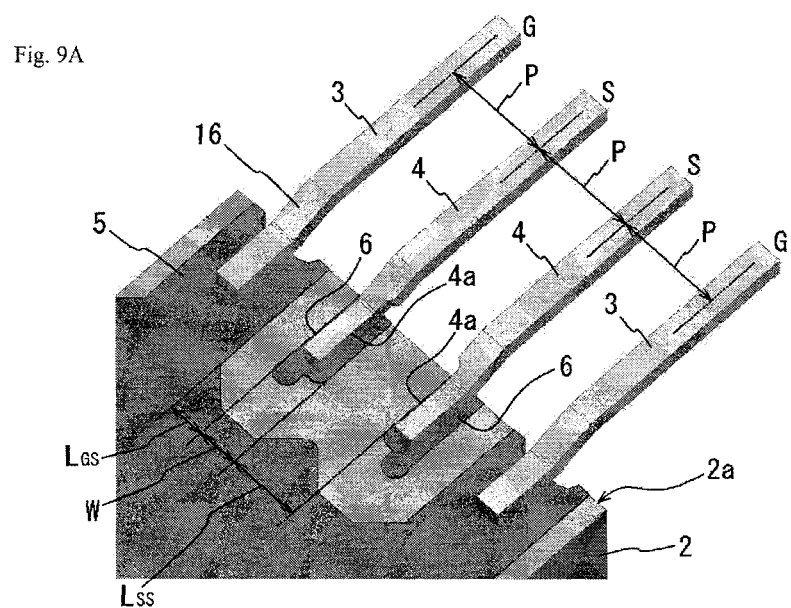
FIG. 9A is a schematic diagram of a GSSG structure 2 used in simulation 2.

Simulation 2 uses the GSSG structure 2 shown in FIG. 9A to determine the characteristic impedance (Ω) and the reflection Sdd11 (dB) around the bonding of the signal lines (S) 4. The results are shown in FIGS. 9B and 9C.

FIG. 9A is a schematic diagram of the GSSG structure 2 used in simulation 2. FIG. 9B is a graph showing the simulation results of the characteristic impedance (Ω) of signal lines (S) (differential transmission lines) in the GSSG structure 2. FIG. 9C is a graph showing the simulation results for the reflection Sdd11 (dB) of the signal lines (S) (differential transmission lines) in the GSSG structure 2. The same components as in FIGS. 1A to 8C are given the same reference numerals, and will not be described.

For the GSSG structure 2 used in simulation 2 as shown in FIG. 9A, the materials used for the ceramic substrate 2, the ground lines (G) 3, the signal lines (S) 4, the first lead pad electrodes 5, and the second lead pad electrodes 6 are shown in Table 2 below. Further, for the GSSG structure 2 used in simulation 2 as shown in FIG. 9A, the interval $L_{GS}$, the dimensions used for the interval $L_{SS}$, the pitch P, the width W of the second lead pad electrodes 6, and the width of lead wires forming the ground lines (G) 3 and the signal lines (S) 4 are shown in Table 2 below.

FIG. 9A also does not show the metal brazing material 11 for bonding the ground lines (G) 3 or the signal lines (S) 4 to the first lead pad electrodes 5 or the second lead pad electrodes 6, or the meniscuses 11a formed by the metal brazing material 11.

TABLE 2

| GSSG Structure 2 | Material/Dimensions |
|---|---|
| Ceramic substrate 2 | Alumina |
| Ground line (G) 3 | Iron-nickel-cobalt alloy |
| Signal line (S) 4 | Iron-nickel-cobalt alloy |
| First lead pad electrode 5 | Tungsten metalized/Ni-plated/Au-plated |
| Second lead pad electrode 6 | Tungsten metalized/Ni-plated/Au-plated |
| Metal brazing material 11 for meniscus 11a | Silver braze |
| $L_{GS}$ | 0.265 mm |
| $L_{SS}$ | 0.53 mm |
| P | 0.8 mm |
| W | 0.32 mm |
| Width of lead wire | 0.2 mm |
| Width of lead wire portion with cutout 4a | 0.15 mm |

Figure 9B:
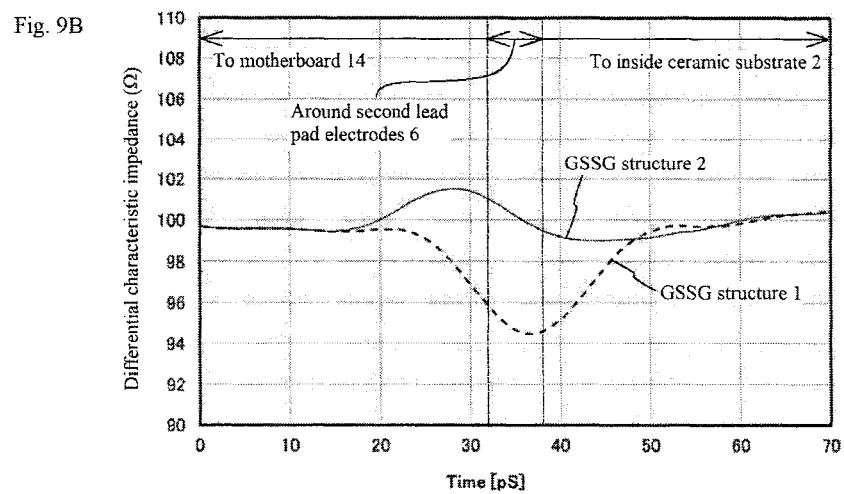
FIG. 9B is a graph showing the simulation results for the characteristic impedance (Ω) of signal lines (S) (differential transmission lines) in the GSSG structure 2.
Figure 9C:
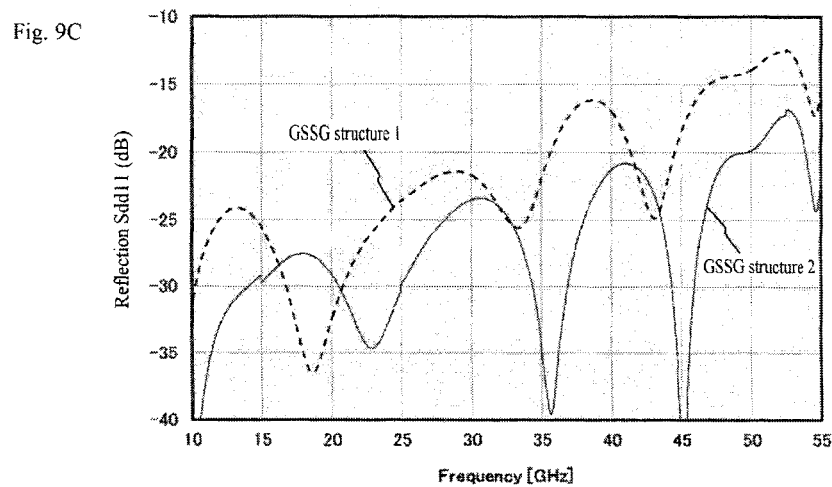
FIG. 9C is a graph showing the simulation results of a reflection Sdd11 (dB) of signal lines (S) (differential transmission lines) in the GSSG structure 2.

As shown in FIG. 9A, the GSSG structure 2 including the second lead pad electrodes 6 with a width W smaller than the width W of GSSG structure 1 successfully adjusts the characteristic impedance around the second lead pad electrodes 6 to near 100Ω (refer to FIG. 9B). As shown in FIG. 9C, the GSSG structure 2 expands the frequency range up to 50 GHz with −20 dB or less in the S parameter Sdd11 (dB), which indicates reflection. Thus, the GSSG structure 2 can appropriately transmit high-frequency signals with frequencies up to 50 GHz.

The GSSG structure 2 including the lead pad electrodes 6 with a smaller width W is likely to have a very low bonding strength between the signal lines (S) 4 and the second lead pad electrodes 6. Thus, the GSSG structure 2 with improved electrical transmission characteristics in high-frequency ranges is unsuitable for practical use.

The bonding strength between the signal lines (S) 4 and the second lead pad electrodes 6 may be increased by setting the width of the second lead pad electrodes 6 to a value at least 0.2 mm greater than the width of the signal lines (S) 4 as viewed from above. When the signal lines (S) 4 with or without the cutouts 4a to be bonded to the second lead pad electrodes 6 have a width within the range of 0.1 to 0.5 mm, the second lead pad electrodes 6 may have a width (W) within a range of 0.3 to 0.7 mm. In other words, the width (W) of the second lead pad electrodes 6 may be determined to position the second edges 6a of each second lead pad electrode 6 at least 0.1 mm away from the two edges of the signal lines (S) 4 when the second lead pad electrodes 6 to which the signal lines (S) 4 are bonded are viewed from above.

Subsequently, based on the results of simulation 2 above, a GSSG structure 3 (comparative example) was designed to adjust the characteristic impedance around the second lead pad electrodes 6 to near 100Ω without decreasing the width W of the second lead pad electrodes 6. More specifically, the GSSG structure 3 is under the same condition as the GSSG structure 1 except for the recess 7a between the second lead pad electrodes 6.

The GSSG structure 3 and the results of simulations 3 using the GSSG structure 3 will now be described with reference to FIGS. 10A to 10C.

Figure 10A:
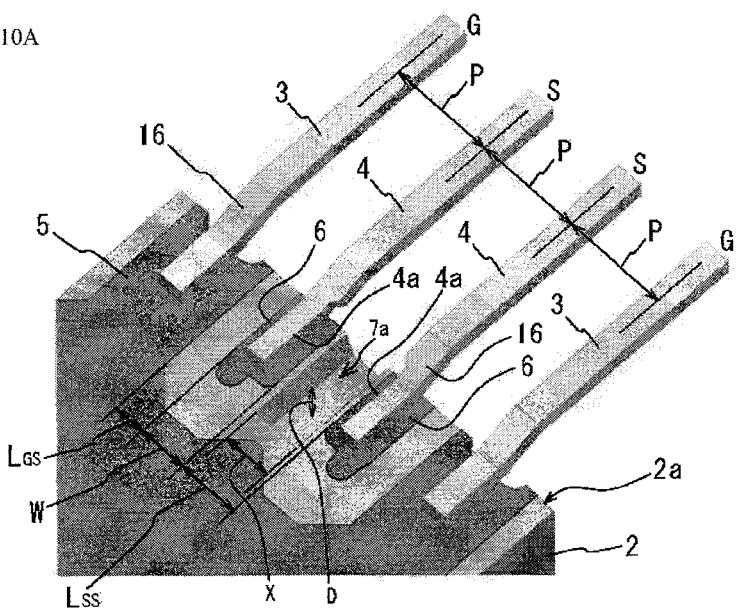
FIG. 10A is a schematic diagram of the GSSG structure 3 used in simulation 3.

Simulation 3 uses the GSSG structure 3 shown in FIG. 10A to determine the characteristic impedance (Ω) and the reflection Sdd11 (dB) around the bonding of the signal lines (S) 4. The results are shown in FIGS. 10B and 10C.

FIG. 10A is a schematic diagram of the GSSG structure 3 used in simulation 3. FIG. 10B is a graph showing the simulation results of the characteristic impedance (Ω) of signal lines (S) (differential transmission lines) in the GSSG structure 3. FIG. 10C is a graph showing the simulation results for the reflection Sdd11 (dB) of the signal lines (S) (differential transmission lines) of the GSSG structure 3. The same components as in FIGS. 1A to 9C are given the same reference numerals, and will not be described.

For the GSSG structure 3 used in simulation 3 shown in FIG. 10A, the materials used for the ceramic substrate 2, the ground lines (G) 3, the signal lines (S) 4, the first lead pad electrodes 5, and the second lead pad electrodes 6 are shown in Table 3 below. Further, for the GSSG structure 3 used in simulation 3 as shown in FIG. 10A, the dimensions used for the interval $L_{GS}$, the interval $L_{SS}$, the pitch P, the width W of the second lead pad electrodes 6, the width of lead wires forming the ground lines (G) 3 and the signal lines (S) 4, and the width X, the depth D, and the length Z of the recess 7a are shown in Table 3.

FIG. 10A also does not show the metal brazing material 11 for bonding the ground lines (G) 3 or the signal lines (S) 4 to the first lead pad electrodes 5 or the second lead pad electrodes 6, or the meniscuses 11a formed by the metal brazing material 11.

TABLE 3

| GSSG Structure 3 | Material/Dimensions |
|---|---|
| Ceramic substrate 2 | Alumina |
| Ground line (G) 3 | Iron-nickel-cobalt alloy |
| Signal line (S) 4 | Iron-nickel-cobalt alloy |
| First lead pad electrode 5 | Tungsten metalized/Ni-plated/Au-plated |
| Second lead pad electrode 6 | Tungsten metalized/Ni-plated/Au-plated |
| Metal brazing material 11 for meniscus 11a | Silver braze |
| $L_{GS}$ | 0.225 mm |
| $L_{SS}$ | 0.45 mm |
| P | 0.8 mm |
| W | 0.4 mm |
| Width of lead wire | 0.2 mm |
| Width of lead wire portion with cutout 4a | 0.15 mm |
| Width X of recess 7a | 0.35 mm |
| Depth D of recess 7a | 0.2 mm |
| Length Z of recess 7a | 0.7 mm |

As shown in FIG. 10A, the GSSG structure 3 includes the recess 7a between the second lead pad electrodes 6. This structure has the improved characteristic impedance around the second lead pad electrodes 6 to about 98Ω as shown in FIG. 10B.

Figure 10B:
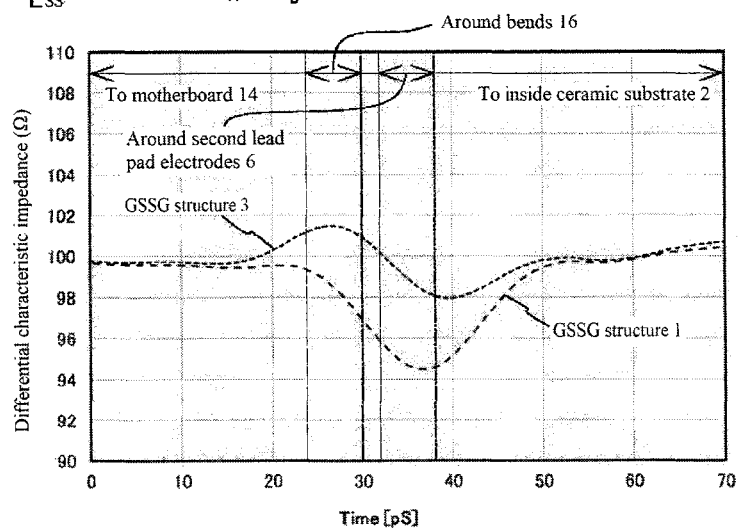
FIG. 10B is a graph showing the simulation results for the characteristic impedance (Ω) of signal lines (S) (differential transmission lines) in the GSSG structure 3.
Figure 10C:
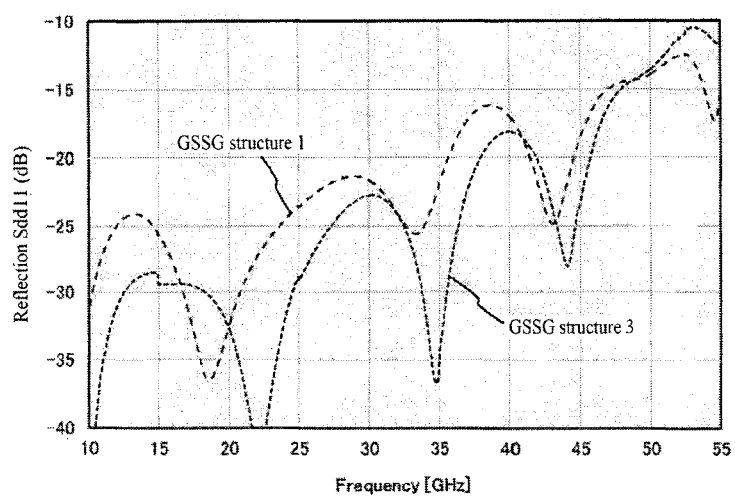
FIG. 10C is a graph showing the simulation results for a reflection Sdd11 (dB) of the signal lines (S) (differential transmission lines) in the GSSG structure 3.

However, as shown in FIG. 10C, the GSSG structure 3 shows frequencies up to 38 GHz with −20 dB or less in the S parameter Sdd11 (dB), which indicates reflection, and thus is unsuitable for transmitting high-frequency signals in the range of 38 to 50 GHz.

As shown in FIG. 10B, these results may be due to a difference of about 3 to 4Ω in the characteristic impedance between around the second lead pad electrodes 6 and around the bends 16 of signal lines (S) 4 in the GSSG structure 3.

Based on the results of simulation 3 above, the GSSG structure according to an example of the present invention (working example) was designed to further reduce the difference in the characteristic impedance between around the second lead pad electrodes 6 and around the bends 16 of the signal lines (S) 4 without the recess 7a between the first lead pad electrodes 5 and the second lead pad electrodes 6.

More specifically, the GSSG structure according to the working example of the present invention has a decreased interval $L_{SS}$ between the second lead pad electrodes 6, and a smaller width X for the recess 7a than the interval and the width defined in the GSSG structure 3. This structural change increases the interval $L_{GS}$ between the first lead pad electrodes 5 and the second lead pad electrodes 6 to exceed the interval defined in the GSSG structure 3. In the GSSG structure according to the working example, the depth D of the recess 7a is the same as the depth D of the recess 7a in the GSSG structure 3. The GSSG structure according to the working example, and the results of simulations 4 for the GSSG structure according to the working example will now be described with reference to FIGS. 11A to 11C.

Figure 11B:
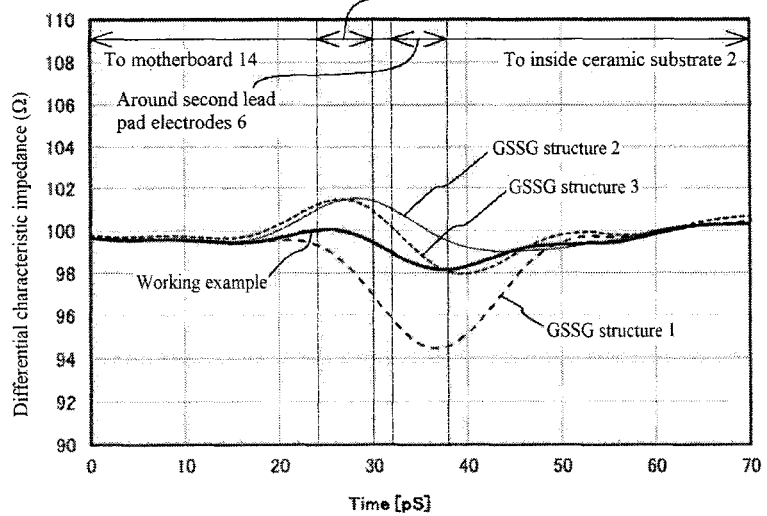
FIG. 11B is a graph showing the simulation results for the characteristic impedance (Ω) of the signal lines (S) (differential transmission lines) in the GSSG structure of the working example.
Figure 11C:
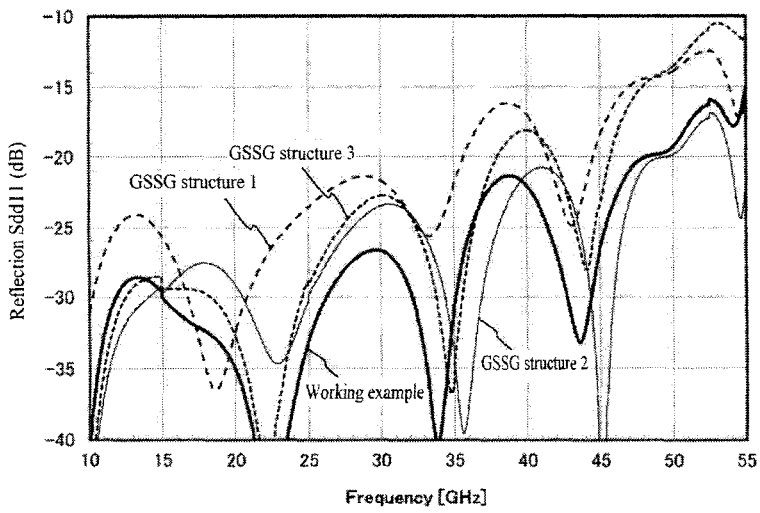
FIG. 11C is a graph showing the simulation results for a reflection Sdd11 (dB) of signal lines (S) (differential transmission lines) in the GSSG structure.

Simulation 4 uses the GSSG structure according to the working example shown in FIG. 11A to determine the characteristic impedance (Ω) and the reflection Sdd11 (dB) around the bonding of the signal lines (S) 4. The results are shown in FIGS. 11B and 11C.

FIG. 11A is a schematic diagram of the GSSG structure used in simulation 4. FIG. 11B is a graph showing the simulation results for the characteristic impedance (Ω) of the signal lines (S) (differential transmission lines) in the GSSG structure according to the working example. FIG. 11C is a graph showing the simulation results for the reflection Sdd11 (dB) of the signal lines (S) (differential transmission line) in the GSSG structure. The same components as in FIGS. 1A to 10C are given the same reference numerals, and will not be described.

For the GSSG structure used in simulation 4 (according to the working example) shown in FIG. 11A, the materials used for the ceramic substrate 2, the ground lines (G) 3, the signal lines (S) 4, the first lead pad electrodes 5, and the second lead pad electrodes 6 are shown in Table 4 below. Further, for the GSSG structure used in simulation 4 as shown in FIG. 11A (according to the working example), the dimensions used for the interval $L_{GS}$, the interval $L_{SS}$, the pitch P, the width W of the second lead pad electrodes 6, the width of lead wires for the ground lines (G) 3 and the signal lines (S) 4, and the width X, the depth D, and the length Z of the recess 7a are shown in Table 4 below.

FIG. 11A also does not show the metal brazing material 11 for bonding the ground lines (G) 3 or the signal lines (S) 4 to the first lead pad electrodes 5 or the second lead pad electrodes 6, or the meniscuses 11a formed by the metal brazing metal 11.

TABLE 4

| GSSG Structure of Working Example | Material/Dimensions |
| --- | --- |
| Ceramic substrate 2 | Alumina |
| Ground line (G) 3 | Iron-nickel-cobalt alloy |
| Signal line (S) 4 | Iron-nickel-cobalt alloy |
| First lead pad electrode 5 | Tungsten metalized/Ni-plated/Au-plated |
| Second lead pad electrode 6 | Tungsten metalized/Ni-plated/Au-plated |
| Metal brazing material 11 for meniscus 11a | Silver braze |
| $L_{GS}$ | 0.275 mm |
| $L_{SS}$ | 0.35 mm |
| P | 0.8 mm |
| W | 0.4 mm |
| Width of lead wire | 0.2 mm |
| Width of lead wire portion with cutout 4a | 0.15 mm |
| Width X of recess 7a | 0.25 mm |
| Depth D of recess 7a | 0.2 mm |
| Length Z of recess 7a | 0.7 mm |

As shown in FIG. 11A, the GSSG structure according to the working example successfully reduces the difference in the characteristic impedance between around the second lead pad electrodes 6 and around the bends 16 of the signal lines (S) 4. More specifically, the GSSG structure according to the working example has the improved characteristic impedance around the second lead pad electrodes 6 to about 98Ω, and also reduces the difference in the characteristic impedance between around the second lead pad electrodes 6 and around the bends 16 of the signal lines (S) 4 to about 2Ω.

As shown in FIG. 11C, the GSSG structure according to the working example also improves the frequency up to 50 GHz with −20 dB or less in the S parameter Sdd11 (dB), which indicates reflection.

Thus, the GSSG structure according to the working example can reduce the inconsistency in the characteristic impedance between around the second lead pad electrodes 6 and around the bends 16 of the signal lines (S) 4 without a recess between the first lead pad electrodes 5 and the second lead pad electrodes 6 or decreasing the width W of the second lead pad electrodes 6. Thus, the structure according to the working example can appropriately transmit high-frequency signals with frequencies up to 50 GHz.

In other words, when the ceramic substrate 2 has a relative dielectric constant of 4.0 or higher, the GSSG structure, which has the second lead pad electrodes 6 arranged with an interval $L_{SS}$ and an interval $L_{GS}$ satisfying $L_{SS} < 2L_{GS}$ and one of the recesses 7a to 7c between the second lead pad electrodes 6 (GSSG structure of the working example), can appropriately transmit high-frequency signals with frequencies up to 50 GHz. The ceramic substrates usable for the GSSG structure of the working example have relative dielectric constants listed below.

Relative dielectric constant of alumina substrate: 8.5 to 10 (this varies depending on the alumina content and the additives)

Relative dielectric constant of zirconia-containing alumina substrate: 10 to 15

Relative dielectric constant of aluminum nitride substrate: 8.8

Relative dielectric constant of glass ceramic substrate: 4 to 10 (a variety of glass ceramics can have different relative dielectric constants depending on their components)

Relative dielectric constant of silicon nitride substrate: 8.1

The GSSG structure according to the working example can minimize the number and/or the volume of recesses 7a in the ceramic substrate 2. This can reduce a decrease in the strength around the peripheral portion 2a of the ceramic substrate 2 in the structure of the working example.

The ceramic substrate 2 is effectively prevented from breaking during manufacture or use of the high-frequency ceramic board according to the embodiments of the present invention and the high-frequency semiconductor element package including the high-frequency ceramic board according to the embodiments. The high-frequency ceramic board and the high-frequency semiconductor element package including the ceramic board manufactured and provided according to the embodiments of the present invention is small, highly functional, and highly reliable.

Also, the GSSG structure according to the working example includes the second lead pad electrodes 6 with an intended width W on the ceramic substrate 2, and the edges of the signal lines (S) 4 can thus have areas for the meniscuses 11a of the metal brazing material 11 to form sufficiently to connect the signal lines (S) 4 to the second lead pad electrodes 6. This structure can prevent a decrease in the bonding strength between the second lead pad electrodes 6 and the signal lines (S) 4 for the smaller ceramic substrate 2 with smaller areas for the second lead pad electrodes 6.

The high-frequency ceramic board manufactured and provided using the GSSG structure according to the working example enables the high-frequency semiconductor element package including the high-frequency ceramic board to have high reliability.

INDUSTRIAL APPLICABILITY

As described above, the high-frequency ceramic board and the high-frequency semiconductor element package including the ceramic board according to the embodiments of the present invention appropriately transmit electric signals with frequencies exceeding 40 GHz and are highly reliable. The board and the package are thus usable in the technical field relevant to electronic components.

REFERENCE SIGNS LIST 1A to 1D high-frequency ceramic board
2 ceramic substrate
2a peripheral portion
3 ground line (G)
4 signal line (S)
4a cutout
4b end
5 first lead pad electrode
5a first edge
6 second lead pad electrode
6a second edge
7a to 7c recess
8 heatsink plate
9 frame
9a opening
10 metal ring
11 metal brazing material
11a meniscus
12 semiconductor element mounting pad
13 high-frequency semiconductor element package
14 motherboard
15 connection pad
16 bend
17 first lead pad electrode
18 differential transmission line

The invention claimed is:
1. A high-frequency ceramic board, comprising:
a flat ceramic substrate;
a pair of ground lines bonded to a peripheral portion of a back surface of the ceramic substrate;
a first lead pad electrode or a pair of first lead pad electrodes attached where the pair of ground lines is bonded;
at least one pair of signal lines bonded between the pair of ground lines;
second lead pad electrodes attached where the signal lines are bonded; and
wherein a groove-like recess is formed between a pair of the second lead pad electrodes adjacent to one another on the back surface of the ceramic substrate,
the pair of signal lines forms a differential transmission line,
the pair of second lead pad electrodes are arranged between two parts of the first lead pad electrode or the pair of first lead pad electrodes,
each second lead pad electrode has second edges in a longitudinal direction including a second edge facing a first edge of the first lead pad electrode, and the first edge and the second edge facing each other are at least partially parallel to each other, and
$L_{SS} < 2L_{GS}$, where $L_{GS}$ is an interval between the first edge and the second edge facing each other, and $L_{SS}$ is an interval between facing second edges of adjacent ones of the second lead pad electrodes,
each signal line has a longitudinal cutout at an end, the longitudinal cutout being bonded to a corresponding one of the second lead pad electrodes at an edge facing the first edge when the ceramic substrate is viewed from above, and
the cutout allows a metal brazing material to form a meniscus around the cutout.

2. The high-frequency ceramic board according to claim 1, wherein
$D < 1.5W$, where W is a width of each second lead pad electrode, and D is a depth of the recess.

3. The high-frequency ceramic board according to claim 1, wherein
the ground lines and the signal lines each have a bend adjacent to the peripheral portion of the ceramic substrate, and
the groove-like recess includes a first part having a width $X_1$ and a second part having a width $X_2$, such that the first part and the second part are arranged in series between the pair of the second lead pad electrodes, the first part and the second part extending in a extending direction of the pair of the second lead pad electrodes, where $0.1X_1 < X_2 < X_1$.

4. The high-frequency ceramic board according to claim 1, wherein
the ground lines and the signal lines each have a bend adjacent to the peripheral portion of the ceramic substrate, and
a distance exists from an end of the peripheral portion of the ceramic substrate to the recess.

5. A high-frequency semiconductor element package, comprising:
the high-frequency ceramic board according to claim 1;
a semiconductor element mounting pad attached on a main surface of the ceramic substrate; and
a ceramic frame surrounding the semiconductor element mounting pad and integrally bonded to the main surface of the ceramic substrate.

6. The high-frequency ceramic board according to claim 2, wherein
the ground lines and the signal lines each have a bend adjacent to the peripheral portion of the ceramic substrate, and
the groove-like recess includes a first part having a width $X_1$ and a second part having a width $X_2$, such that the first part and the second part are arranged in series between the pair of the second lead pad electrodes, the first part and the second part extending in a extending direction of the pair of the second lead pad electrodes, where $0.1X_1 < X_2 < X_1$.

7. The high-frequency ceramic board according to claim 2, wherein
the ground lines and the signal lines each have a bend adjacent to the peripheral portion of the ceramic substrate, and
a distance exists from an end of the peripheral portion of the ceramic substrate to the recess.

8. A high-frequency semiconductor element package, comprising:
the high-frequency ceramic board according to claim 2;
a semiconductor element mounting pad attached on a main surface of the ceramic substrate; and
a ceramic frame surrounding the semiconductor element mounting pad and integrally bonded to the main surface of the ceramic substrate.

9. A high-frequency semiconductor element package, comprising:
the high-frequency ceramic board according to claim 3;
a semiconductor element mounting pad attached on a main surface of the ceramic substrate; and
a ceramic frame surrounding the semiconductor element mounting pad and integrally bonded to the main surface of the ceramic substrate.

10. A high-frequency semiconductor element package, comprising:
the high-frequency ceramic board according to claim 4;
a semiconductor element mounting pad attached on a main surface of the ceramic substrate; and
a ceramic frame surrounding the semiconductor element mounting pad and integrally bonded to the main surface of the ceramic substrate.

* * * * *